US008481988B2

(12) United States Patent
Sonehara

(10) Patent No.: US 8,481,988 B2
(45) Date of Patent: Jul. 9, 2013

(54) RESISTANCE CHANGE MEMORY AND MANUFACTURING METHOD THEREOF

(75) Inventor: Takeshi Sonehara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 297 days.

(21) Appl. No.: 12/886,118

(22) Filed: Sep. 20, 2010

(65) Prior Publication Data
US 2011/0133149 A1 Jun. 9, 2011

(30) Foreign Application Priority Data

Dec. 4, 2009 (JP) .................................. 2009-276636

(51) Int. Cl.
*H01L 21/00* (2006.01)
(52) U.S. Cl.
USPC ........................................ 257/2; 257/3; 257/4
(58) Field of Classification Search
USPC ........................................................ 257/2–4
See application file for complete search history.

(56) References Cited

U.S. PATENT DOCUMENTS

| | | | | |
|---|---|---|---|---|
| 7,009,208 B2 * | 3/2006 | Aratani et al. | ................ | 257/74 |
| 7,297,990 B1 * | 11/2007 | Berger et al. | ................ | 257/106 |
| 7,425,724 B2 * | 9/2008 | Aratani et al. | ................ | 257/68 |
| 7,812,335 B2 * | 10/2010 | Scheuerlein | ................ | 257/4 |
| 7,830,697 B2 * | 11/2010 | Herner | ................ | 365/148 |
| 8,072,791 B2 * | 12/2011 | Herner et al. | ................ | 365/148 |
| 8,084,830 B2 * | 12/2011 | Kanno et al. | ................ | 257/379 |
| 8,102,694 B2 * | 1/2012 | Herner et al. | ................ | 365/148 |
| 8,120,949 B2 * | 2/2012 | Ranjan et al. | ................ | 365/171 |
| 8,183,552 B2 * | 5/2012 | Nakajima et al. | ................ | 257/2 |
| 8,279,655 B2 * | 10/2012 | Kanno et al. | ................ | 365/148 |
| 2003/0234449 A1 * | 12/2003 | Aratani et al. | ................ | 257/758 |
| 2006/0043595 A1 * | 3/2006 | Aratani et al. | ................ | 257/758 |
| 2007/0253245 A1 * | 11/2007 | Ranjan et al. | ................ | 365/171 |
| 2008/0316795 A1 * | 12/2008 | Herner et al. | ................ | 365/148 |
| 2008/0316808 A1 * | 12/2008 | Herner et al. | ................ | 365/175 |
| 2008/0316809 A1 * | 12/2008 | Herner | ................ | 365/175 |
| 2009/0046501 A1 * | 2/2009 | Ranjan et al. | ................ | 365/171 |

(Continued)

FOREIGN PATENT DOCUMENTS

JP 2009-123725 6/2009
JP 2010287789 A * 12/2010

(Continued)

OTHER PUBLICATIONS

U.S. Appl. No. 12/816,815, filed Jun. 16, 2010, Nobuaki Yasutake, et al.

(Continued)

*Primary Examiner* — Laura Menz
(74) *Attorney, Agent, or Firm* — Oblon, Spivak, McClelland, Maier & Neustadt, L.L.P.

(57) ABSTRACT

According to one embodiment, a resistance change memory includes a first interconnect line extending in a first direction, a second interconnect line extending in a second direction intersecting with the first direction, and a cell unit which is provided between the first interconnect line and the second interconnect line and which includes a non-ohmic element and a memory element, the non-ohmic element including a conductive layer provided on at least one of first and second ends of the cell unit and a silicon portion provided between the first and second ends, the memory element being connected to the non-ohmic element via the conductive layer and storing data in accordance with a reversible change in a resistance state, wherein the non-ohmic element includes a first silicon germanium region in the silicon portion.

11 Claims, 19 Drawing Sheets

U.S. PATENT DOCUMENTS

| | | | |
|---|---|---|---|
| 2009/0140233 A1 | 6/2009 | Kinoshita et al. | |
| 2009/0243002 A1 | 10/2009 | Sonehara et al. | |
| 2009/0283737 A1* | 11/2009 | Kiyotoshi | 257/2 |
| 2009/0283739 A1* | 11/2009 | Kiyotoshi | 257/4 |
| 2010/0038617 A1* | 2/2010 | Nakajima et al. | 257/2 |
| 2010/0213550 A1* | 8/2010 | Kanno et al. | 257/379 |
| 2010/0230721 A1 | 9/2010 | Yasutake | |
| 2010/0315857 A1* | 12/2010 | Sonehara et al. | 365/148 |
| 2010/0321979 A1* | 12/2010 | Yasutake et al. | 365/148 |
| 2011/0127483 A1* | 6/2011 | Sonehara | 257/2 |
| 2011/0133149 A1* | 6/2011 | Sonehara | 257/3 |
| 2011/0147691 A1* | 6/2011 | Yasutake | 257/2 |
| 2011/0193049 A1* | 8/2011 | Iwakaji et al. | 257/4 |
| 2011/0205782 A1* | 8/2011 | Costa et al. | 365/148 |
| 2011/0210304 A1* | 9/2011 | Murooka et al. | 257/2 |
| 2011/0227017 A1* | 9/2011 | Yasutake | 257/2 |
| 2011/0229990 A1* | 9/2011 | Kreupl et al. | 438/17 |
| 2011/0233501 A1* | 9/2011 | Sonehara et al. | 257/2 |
| 2011/0233507 A1* | 9/2011 | Sonehara et al. | 257/4 |
| 2011/0260131 A1* | 10/2011 | Sonehara | 257/2 |
| 2011/0310653 A1* | 12/2011 | Kreupl et al. | 365/148 |
| 2011/0310654 A1* | 12/2011 | Kreupl et al. | 365/148 |
| 2011/0310655 A1* | 12/2011 | Kreupl et al. | 365/148 |
| 2011/0310656 A1* | 12/2011 | Kreupl et al. | 365/148 |
| 2012/0025160 A1* | 2/2012 | Sonehara | 257/2 |
| 2012/0043517 A1* | 2/2012 | Sonehara | 257/2 |
| 2012/0063245 A1* | 3/2012 | Sonehara | 365/189.16 |
| 2012/0107964 A1* | 5/2012 | Ranjan et al. | 438/3 |
| 2012/0119178 A1* | 5/2012 | Scheuerlein et al. | 257/2 |
| 2012/0145984 A1* | 6/2012 | Rabkin et al. | 257/2 |
| 2012/0153249 A1* | 6/2012 | Zhang et al. | 257/4 |
| 2012/0170361 A1* | 7/2012 | Ranjan et al. | 365/171 |
| 2012/0176831 A1* | 7/2012 | Xiao et al. | 365/148 |
| 2012/0217461 A1* | 8/2012 | Kobayashi et al. | 257/2 |
| 2012/0217464 A1* | 8/2012 | Kobayashi et al. | 257/4 |

FOREIGN PATENT DOCUMENTS

| | | | |
|---|---|---|---|
| JP | 2011003719 A | * | 1/2011 |
| JP | 2011119296 A | * | 6/2011 |
| JP | 2011119532 A | * | 6/2011 |
| JP | 2011204814 A | * | 10/2011 |
| JP | 2011222952 A | * | 11/2011 |

OTHER PUBLICATIONS

U.S. Appl. No. 12/844,281, filed Jul. 27, 2010, Takeshi Sonehara.

* cited by examiner

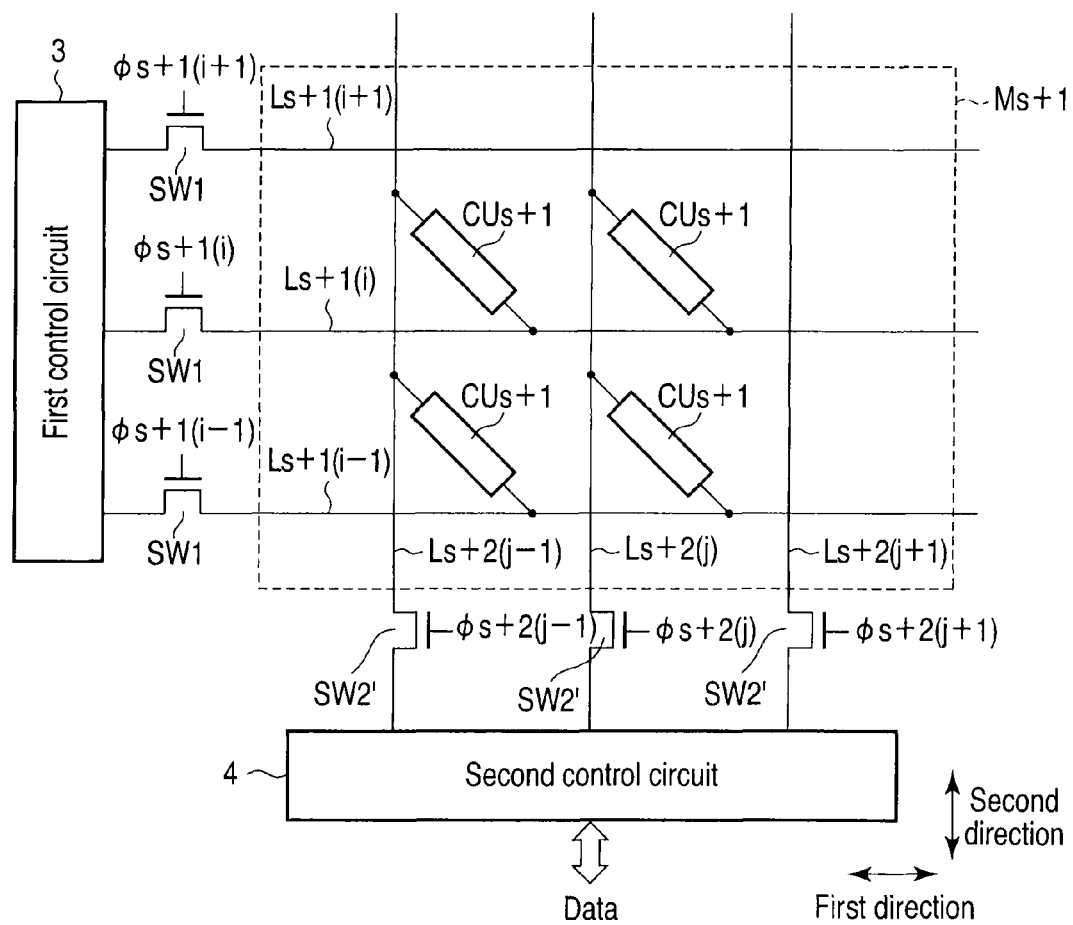
F I G. 5B

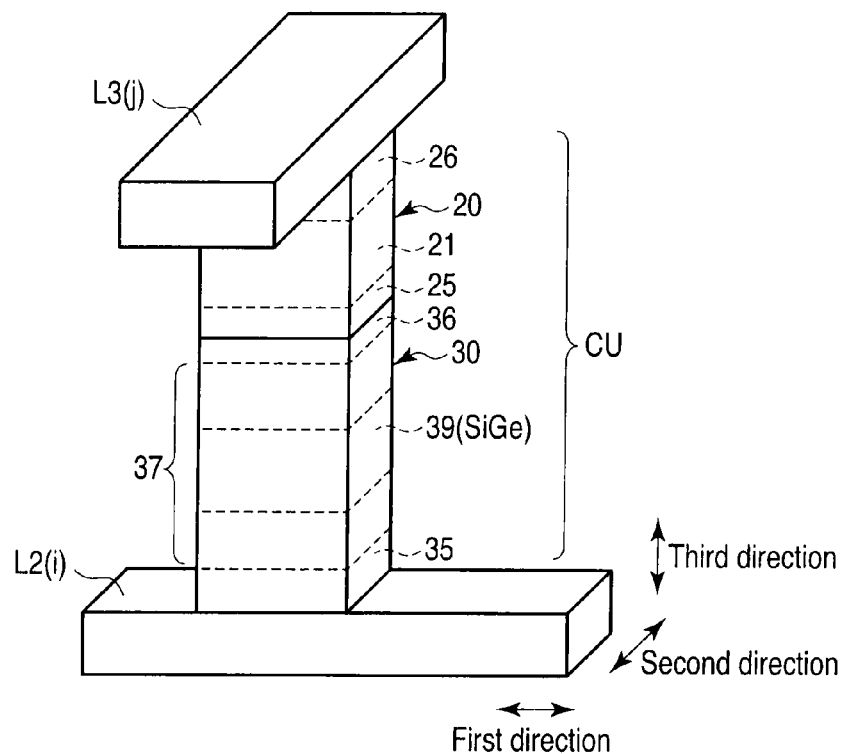
F I G. 7
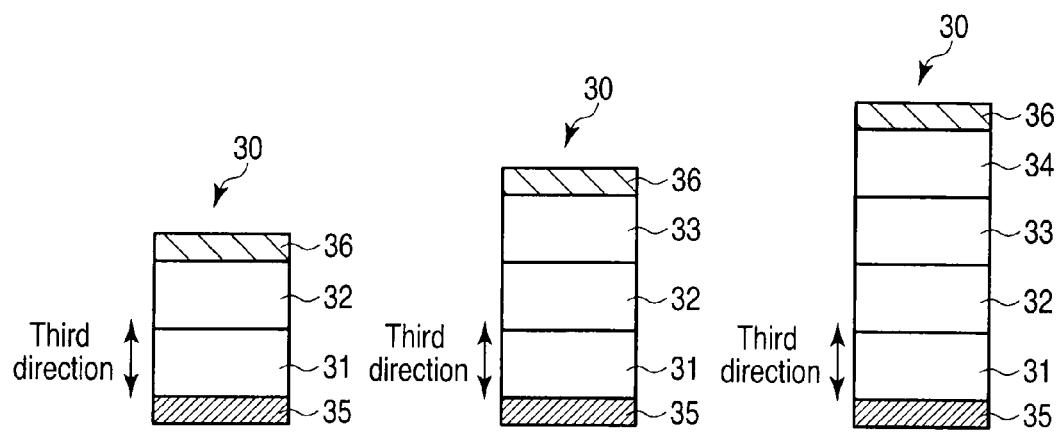
F I G. 8A    F I G. 8B    F I G. 8C

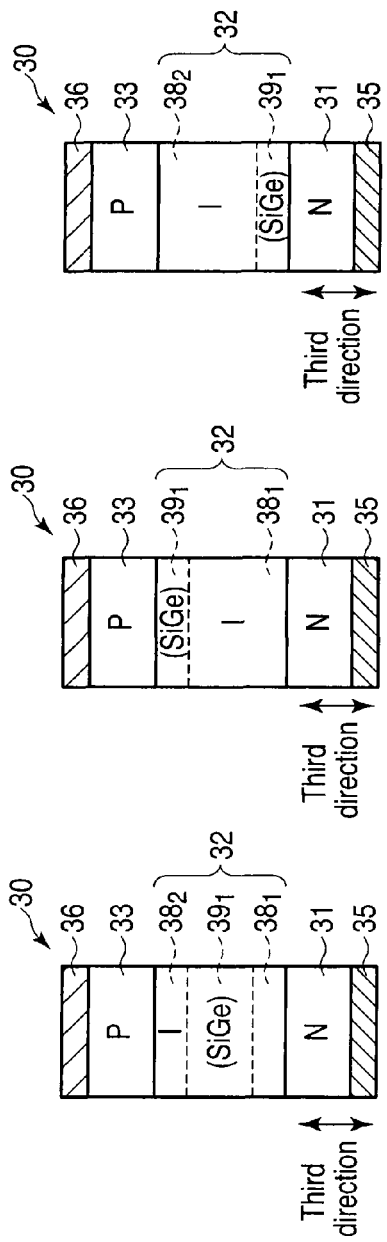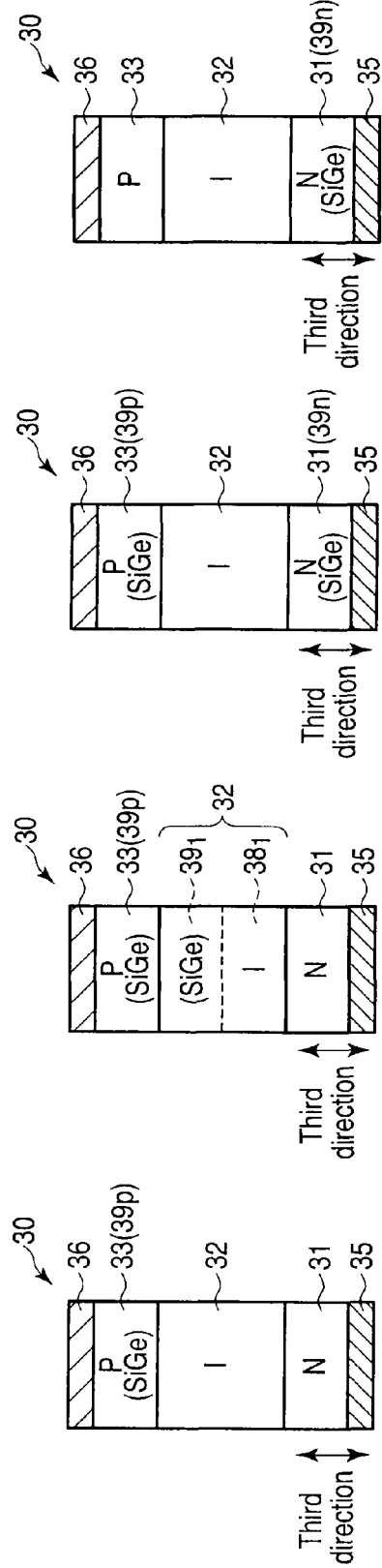

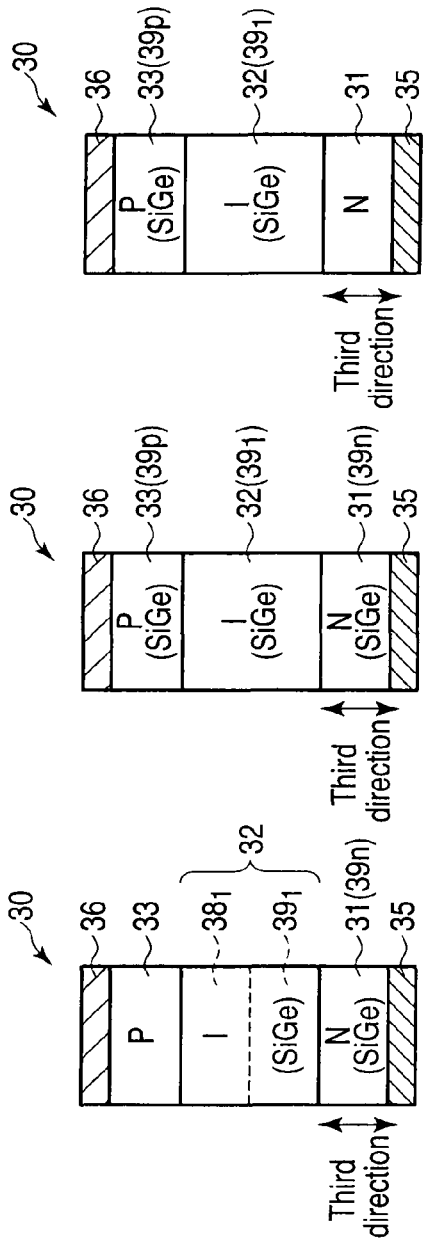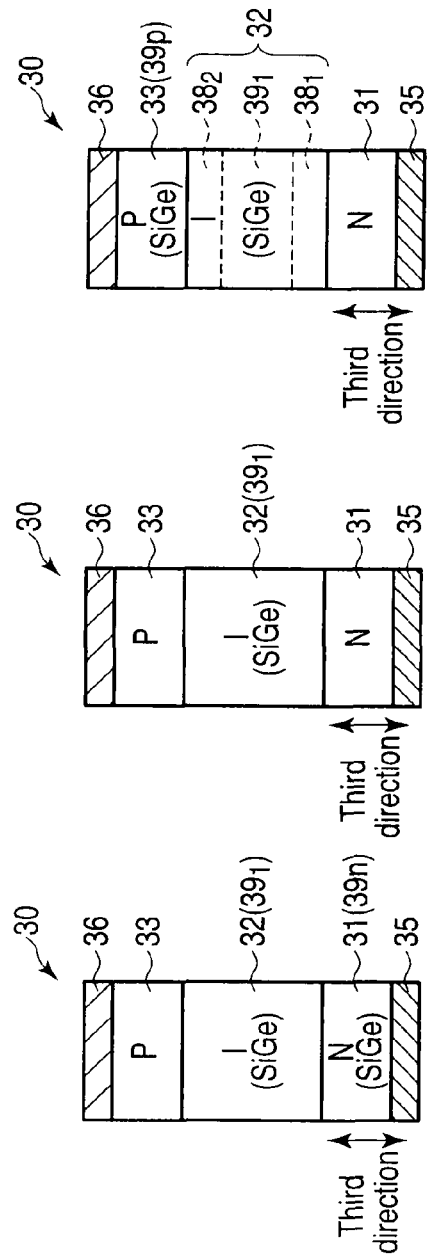

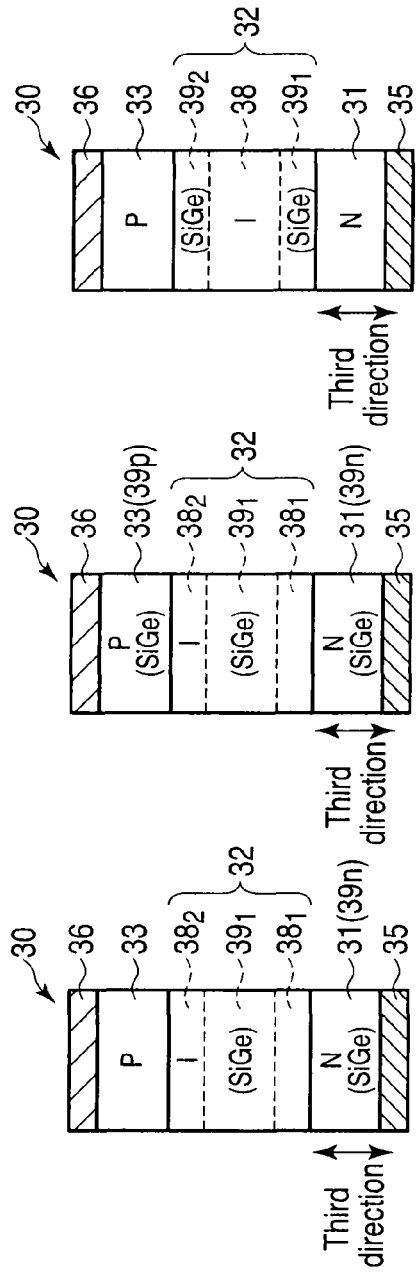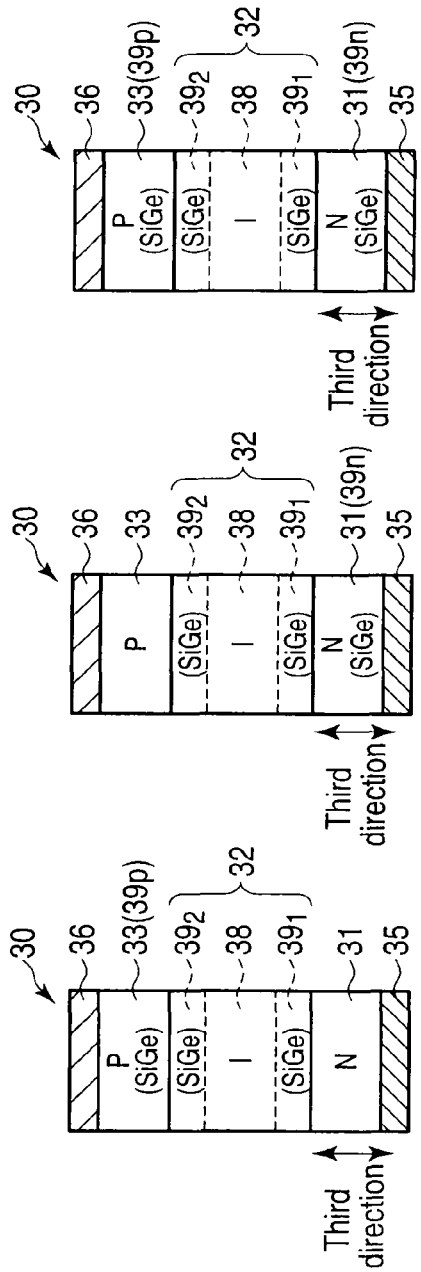

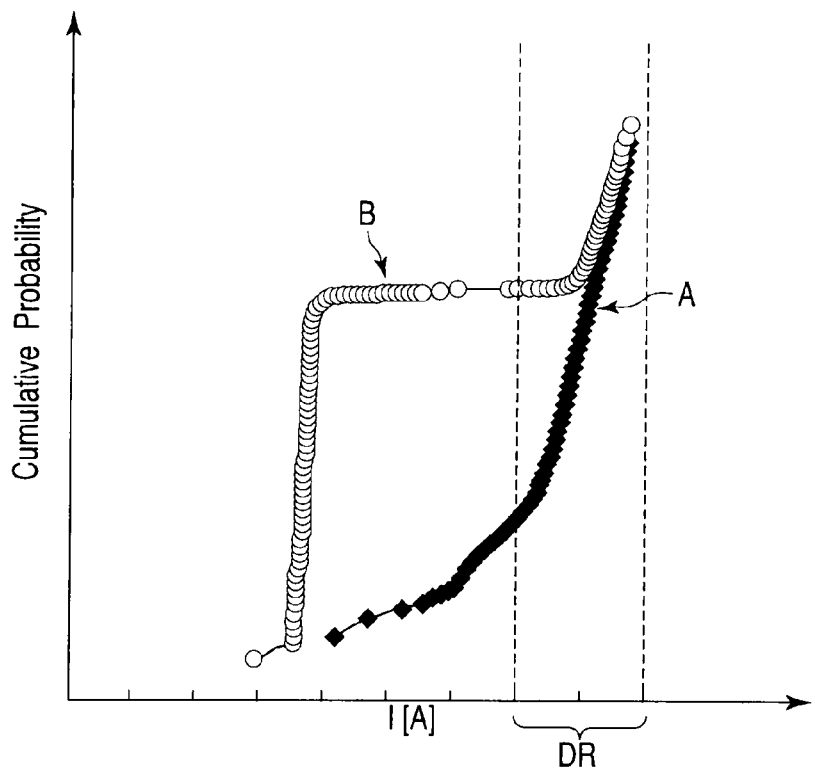
F I G. 11
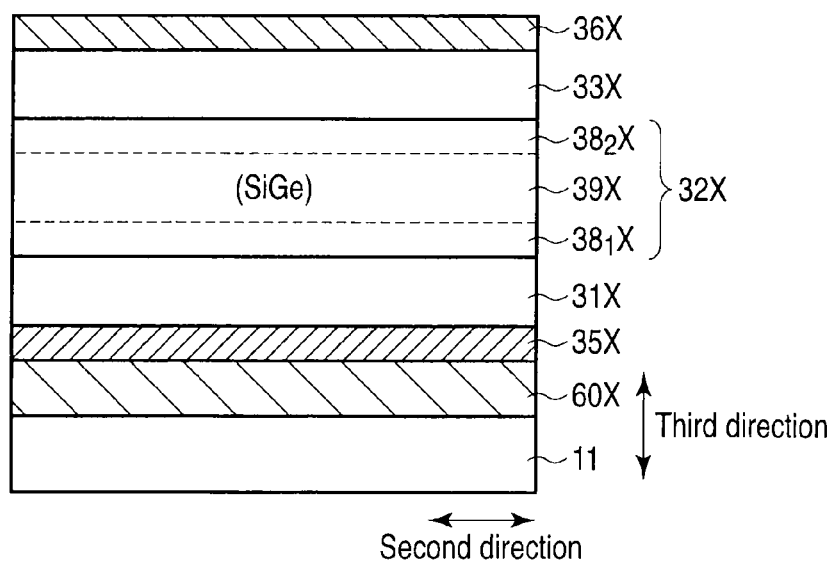
F I G. 12A

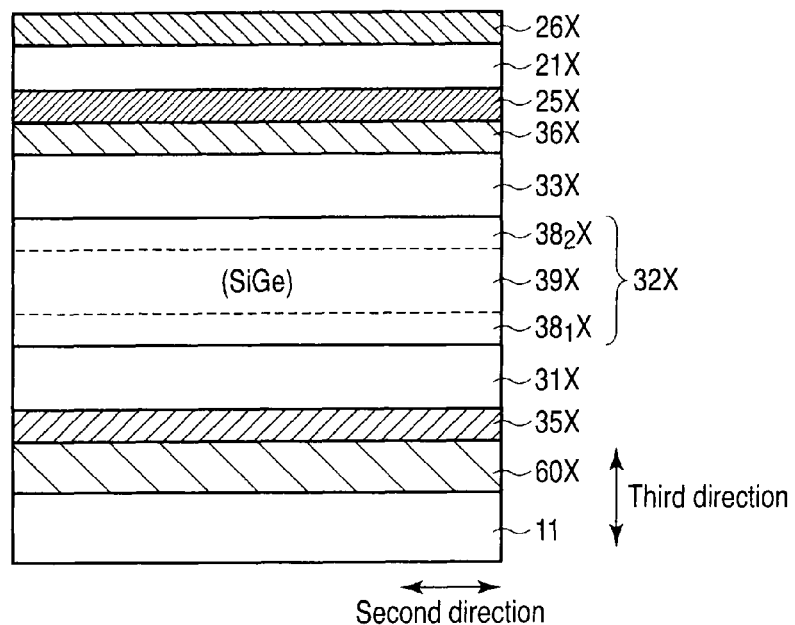
F I G. 12B
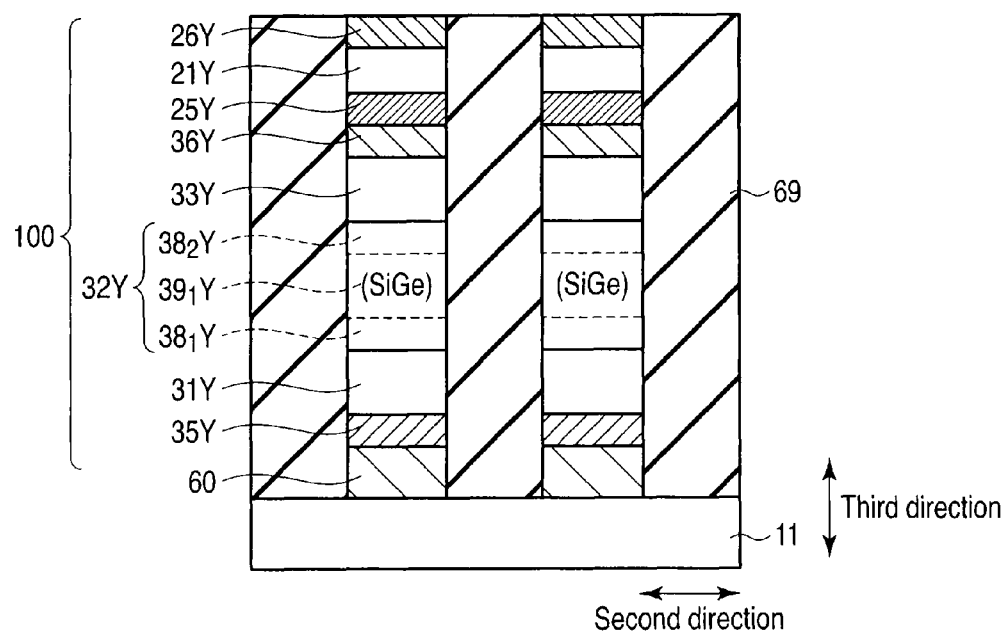
F I G. 12C

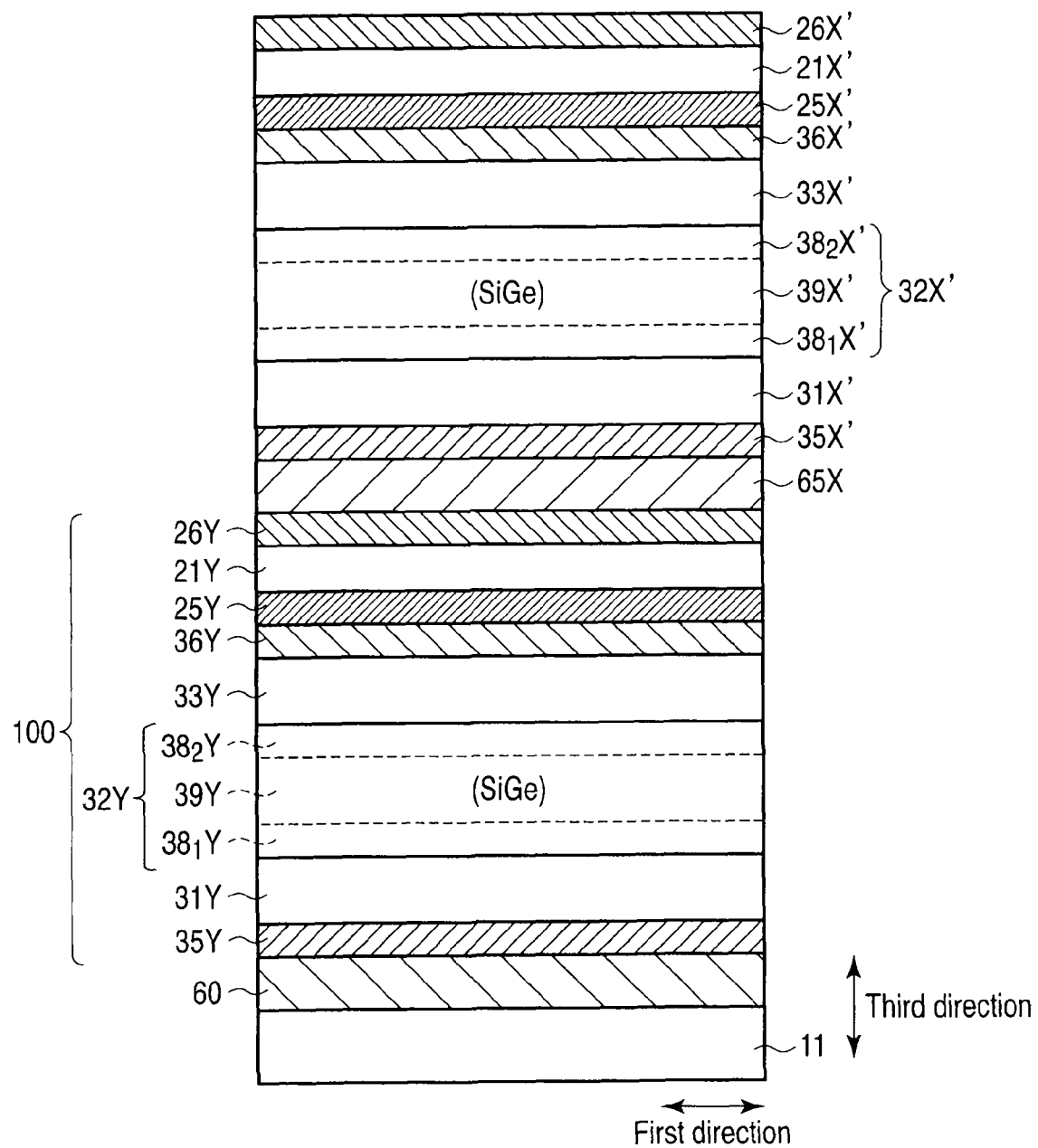
F I G. 12E

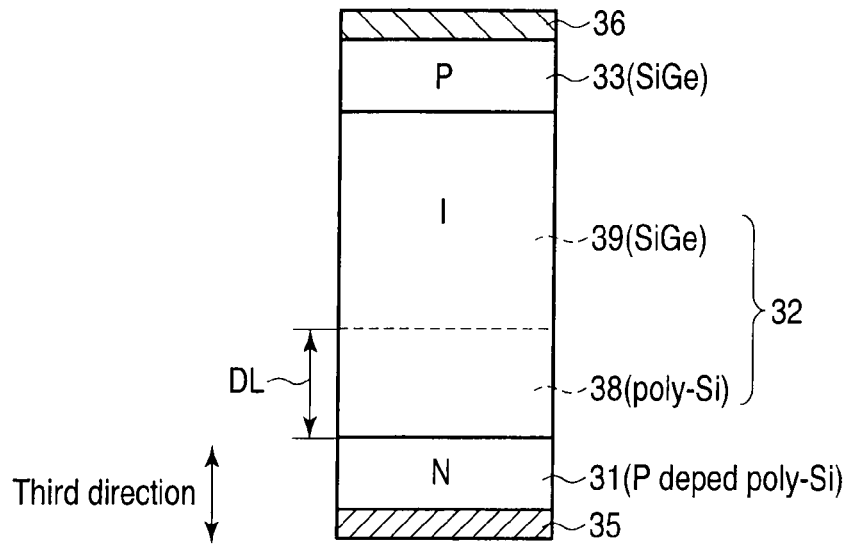
F I G. 15
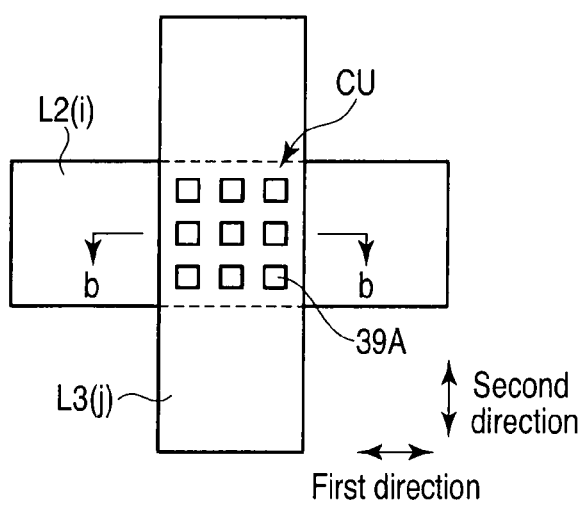
F I G. 16A
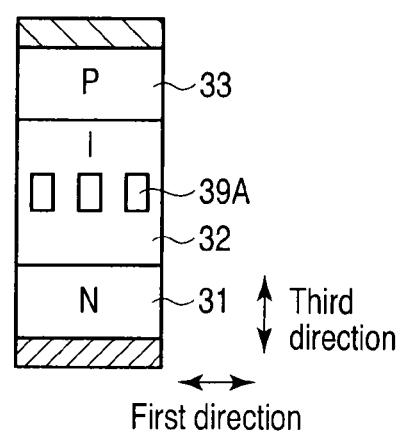
F I G. 16B

RESISTANCE CHANGE MEMORY AND MANUFACTURING METHOD THEREOF

CROSS-REFERENCE TO RELATED APPLICATIONS

This application is based upon and claims the benefit of priority from Japanese Patent Application No. 2009-276636, filed Dec. 4, 2009; the entire contents of which are incorporated herein by reference.

FIELD

Embodiments described herein relate generally to a resistance change memory and manufacturing method thereof.

BACKGROUND

Recently, as next-generation nonvolatile semiconductor memories, resistance change memories have been attracting attention, such as a resistive RAM (ReRAM) in which a variable resistive element serves as a memory element, and a phase change RAM (PCRAM) in which a phase change element serves as a memory element.

These resistance change memories are characterized in that a memory cell array is a cross-point type and a higher memory capacity is thus enabled by three-dimensional integration, and also characterized by being capable of the same high-speed operation as that of a DRAM.

In the resistance change memory, the cross-point type memory cell array comprises a plurality of cell units. The cell unit includes a memory element and a non-ohmic element (e.g., see Jpn. Pat. Appln. KOKAI Publication No. 2009-123725).

In connection with the resistance change memory, miniaturization of the cell unit is underway in order to increase the memory capacity.

Along with the advancing miniaturization of the cell unit, problems that have not been arisen in conventional device sizes are being posed.

One of the problems is associated with the material that forms the non-ohmic element.

A device made of silicon such as a PN diode may be used for the non-ohmic element.

When polysilicon is used as silicon for forming the element, morphological roughness (surface roughness) may be caused in the surface of deposited polysilicon. The morphological roughness degrades the state of the junction (interface) between polysilicon and other parts, and leads to characteristic deterioration of the element that uses silicon along with the miniaturization of the element.

BRIEF DESCRIPTION OF THE DRAWINGS

FIG. 5B is diagram showing the layout of first and second control circuits;
FIG. 7 is a diagram showing an example of the configuration of the cell unit;
FIG. 8A is diagram showing examples of the configuration of a non-ohmic element;
FIG. 8B is diagram showing examples of the configuration of a non-ohmic element;
FIG. 8C is diagram showing examples of the configuration of a non-ohmic element;
FIG. 9A is diagram showing examples of the structure of the non-ohmic element in the resistance change memory according to an embodiment;
FIG. 9B is diagram showing examples of the structure of the non-ohmic element in the resistance change memory according to an embodiment;
FIG. 9C is diagram showing examples of the structure of the non-ohmic element in the resistance change memory according to an embodiment;
FIG. 9D is diagram showing examples of the structure of the non-ohmic element in the resistance change memory according to an embodiment;
FIG. 9E is diagram showing examples of the structure of the non-ohmic element in the resistance change memory according to an embodiment;
FIG. 9F is diagram showing examples of the structure of the non-ohmic element in the resistance change memory according to an embodiment;
FIG. 9G is diagram showing examples of the structure of the non-ohmic element in the resistance change memory according to an embodiment;
FIG. 9H is diagram showing examples of the structure of the non-ohmic element in the resistance change memory according to an embodiment;
FIG. 9I is diagram showing examples of the structure of the non-ohmic element in the resistance change memory according to an embodiment;
FIG. 9J is diagram showing examples of the structure of the non-ohmic element in the resistance change memory according to an embodiment;
FIG. 9K is diagram showing examples of the structure of the non-ohmic element in the resistance change memory according to an embodiment;
FIG. 9L is diagram showing examples of the structure of the non-ohmic element in the resistance change memory according to an embodiment;
FIG. 9M is diagram showing examples of the structure of the non-ohmic element in the resistance change memory according to an embodiment;
FIG. 9N is diagram showing examples of the structure of the non-ohmic element in the resistance change memory according to an embodiment;
FIG. 9O is diagram showing examples of the structure of the non-ohmic element in the resistance change memory according to an embodiment;
FIG. 9P is diagram showing examples of the structure of the non-ohmic element in the resistance change memory according to an embodiment;
FIG. 9Q is diagram showing examples of the structure of the non-ohmic element in the resistance change memory according to an embodiment;
FIG. 9R is diagram showing examples of the structure of the non-ohmic element in the resistance change memory according to an embodiment;
FIG. 9S is diagram showing examples of the structure of the non-ohmic element in the resistance change memory according to an embodiment;

FIG. 11 is a graph showing the electric properties of the non-ohmic element in the resistance change memory according to the embodiment;

FIG. 12A is diagram showing one step of a method of manufacturing the resistance change memory according to the embodiment;

FIG. 12B is diagram showing one step of a method of manufacturing the resistance change memory according to the embodiment;

FIG. 12C is diagram showing one step of a method of manufacturing the resistance change memory according to the embodiment;

FIG. 12E is diagram showing one step of a method of manufacturing the resistance change memory according to the embodiment;

FIG. 15 is a diagram showing the specific example of the non-ohmic element in the resistance change memory according to the embodiment;

FIG. 16A is diagram showing a modification of the non-ohmic element in the resistance change memory according to the embodiment; and FIG. 16B is diagram showing a modification of the non-ohmic element in the resistance change memory according to the embodiment.

DETAILED DESCRIPTION

Hereinafter, present embodiment will be described in detail with reference to the drawings. In the following explanation, elements having the same function and configuration are denoted with the same signs and are repeatedly described when necessary.

In general, according to one embodiment, a resistance change memory includes a first interconnect line extending in a first direction; a second interconnect line extending in a second direction intersecting with the first direction; and a cell unit which is provided between the first interconnect line and the second interconnect line and which includes a non-ohmic element and a memory element, the non-ohmic element including a conductive layer provided on at least one of first and second ends of the cell unit and a silicon portion provided between the first and second ends, the memory element being connected to the non-ohmic element via the conductive layer and storing data in accordance with a reversible change in a resistance state, wherein the non-ohmic element includes a first silicon germanium region in the silicon portion.

The present embodiment is directed to a resistance change memory in which a variable resistive element or a phase change element serves as a memory element.

[Embodiment]

(1) Example

A resistance change memory according to an embodiment of the present embodiment is described with FIG. 1 to FIG. 8C.

Figure 1:
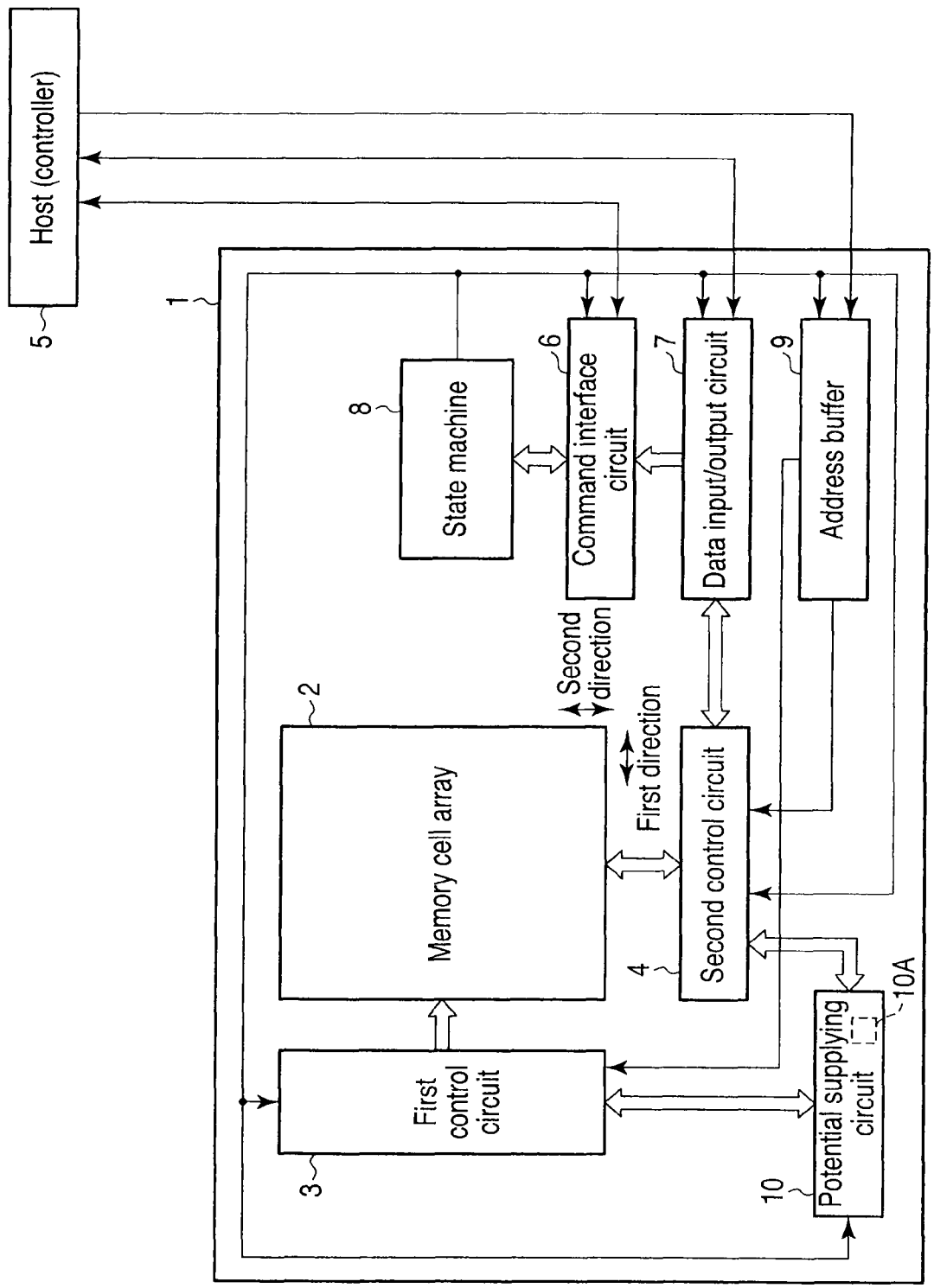
FIG. 1 is a diagram showing a resistance change memory.

FIG. 1 shows essential parts of the resistance change memory.

A resistance change memory (e.g., a chip) 1 has a cross-point type memory cell array 2.

A first control circuit 3 is disposed at one end of the first direction of the memory cell array 2, and a second control circuit 4 is disposed at one end of the second direction that intersects with the first direction.

The first control circuit 3 selects a row of the memory cell array 2 on the basis of, for example, a row address signal. Moreover, the second control circuit 4 selects a column of the memory cell array 2 on the basis of, for example, a column address signal.

The first and second control circuit 3, 4 control writing, erasing and reading of data in a memory element within the memory cell array 2.

Here, in a resistance change memory 1 according to the present embodiment, for example, a write is referred to as a set, and an erasure is referred to as a reset. A resistance value in a set state has only to be different from a resistance value in a reset state, and whether the resistance value in the set state is higher or lower than that in the reset state makes no difference.

Moreover, if one of a plurality of levels of resistance values that can be marked by the memory element can be selectively written in a set operation, a multilevel resistance change memory in which one memory element stores multilevel data can be obtained.

A controller 5 supplies a control signal and data to the resistance change memory 1. The control signal is input to a command/interface circuit 6, and data is input to a data input/output buffer 7. The controller 5 may be disposed in the chip 1 or may be disposed in a chip (host device) different from the chip 1.

The command/interface circuit 6 judges in accordance with the control signal whether data from controller 5 is command data. When the data is command data, the data is transferred from data the input/output buffer 7 to a state machine 8.

The state machine 8 manages the operation of the resistance change memory 1 on the basis of the command data. For example, the state machine 8 manages the set/reset operations and read operation on the basis of command data from the controller 5. The controller 5 can receive status information managed by the state machine 8, and judge the result of the operation in the resistance change memory 1.

In the set/reset operations and read operation, the controller 5 supplies an address signal to the resistance change memory 1. The address signal is input to the first and second control circuits 3, 4 via an address buffer 9.

A potential supplying circuit 10 outputs, at a predetermined timing, a voltage pulse or current pulse necessary for, for example, the set/reset operations and read operation in accordance with an instruction from the state machine 8. The potential supplying circuit 10 includes a pulse generator 10A, and control, in accordance with the operation indicated by the command data and control signal, the voltage value/current value of a voltage pulse/current pulse to output, and/or the pulse width.

Figure 2:
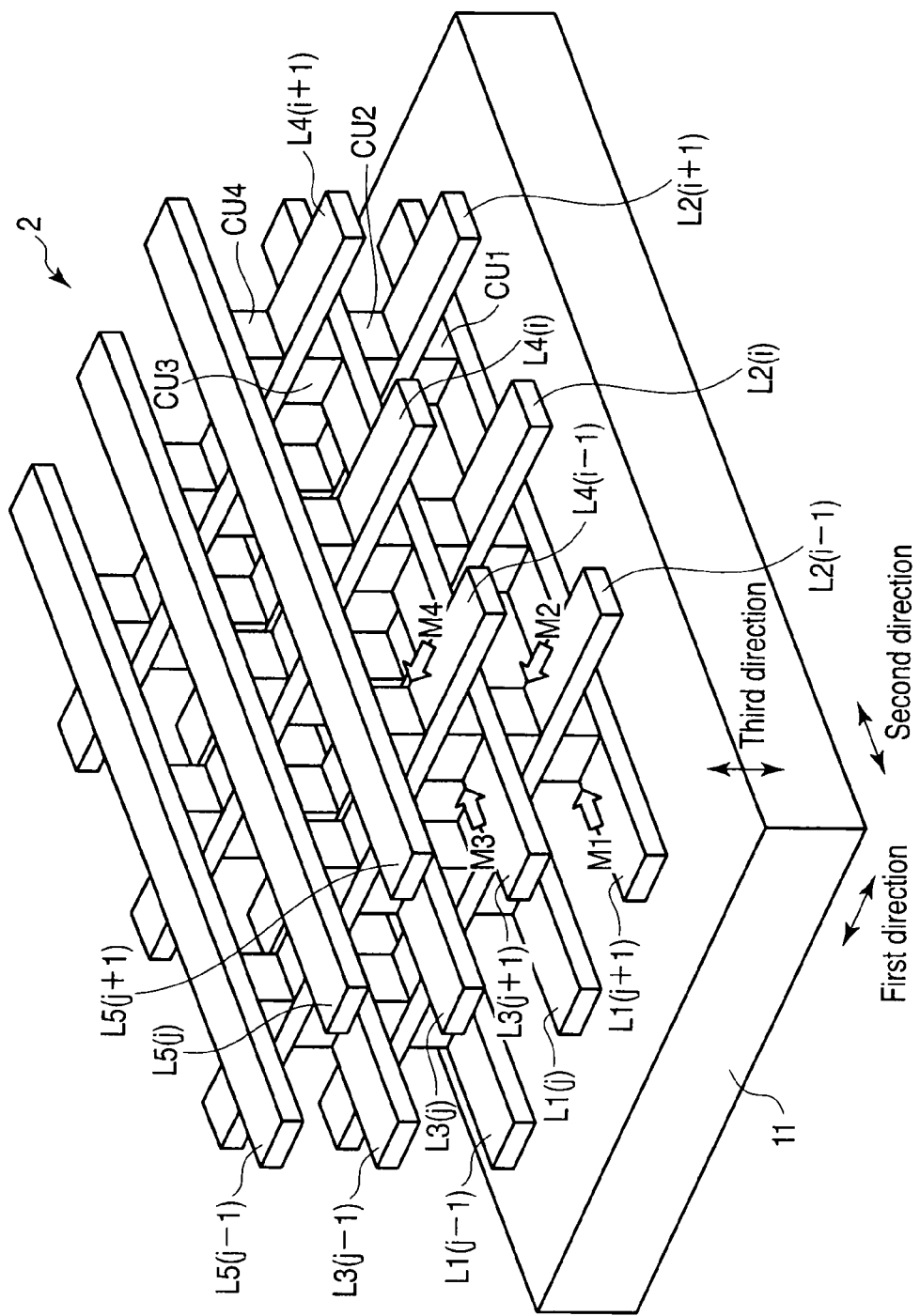
FIG. 2 is a diagram showing an example of the configuration of a memory cell array in the resistance change memory.

FIG. 2 is a bird's-eye view showing the structure of the memory cell array. The memory cell array 2 shown in FIG. 2 has a cross-point type structure.

The cross-point type memory cell array 2 is disposed on a substrate 11. The substrate 11 is a semiconductor substrate (e.g., a silicon substrate), or an interlayer insulating film on a semiconductor substrate. In addition, when the substrate 11 is an interlayer insulating film, a circuit that uses, for example, a field effect transistor may be formed as a peripheral circuit of the memory on the surface of a semiconductor substrate under the cross-point type memory cell array 2.

The cross-point type memory cell array 2 is configured by, for example, a stack structure of a plurality of memory cell arrays (also referred to as memory cell layers).

FIG. 2 shows, by way of example, the case where the cross-point type memory cell array 2 is composed of four memory cell arrays M1, M2, M3, M4 that are stacked in the third direction (a direction perpendicular to the main plane of the substrate 11). The number of memory cell arrays stacked has only to be two or more. In addition, the cross-point type memory cell array 2 may be configured by one memory cell array. Alternatively, an insulating film may be provided between two memory cell arrays stacked, and the two memory cell arrays may be electrically separated by the insulating film.

When the plurality of memory cell arrays M1, M2, M3, M4 are stacked, the address signal includes, for example, a memory cell array selection signal, a row address signal and a column address signal. The first and second control circuits 3, 4 select one of the stacked memory cell arrays in accordance with, for example, the memory cell array selection signal. The first and second control circuits 3, 4 can write/erase/read data in one of the stacked memory cell arrays, or can simultaneously write/erase/read data in two or more or all of the stacked memory cell arrays.

The memory cell array M1 is composed of a plurality of cell units CU1 arrayed in the first and second directions. Similarly, the memory cell array M2 is composed of a plurality of arrayed cell units CU2, the memory cell array M3 is composed of a plurality of arrayed cell units CU3, and the memory cell array M4 is composed of a plurality of arrayed cell units CU4.

Each of the cell units CU1, CU2, CU3, CU4 is composed of a memory element and a non-ohmic element that are connected in series.

Furthermore, on the substrate 11, there are arranged, in order from the side of the substrate 11,
interconnect lines L1(j−1), L1(j), L1(j+1),
interconnect lines L2(i−1), L2(i), L2(i+1),
interconnect lines L3(j−1), L3(j), L3(j+1),
interconnect lines L4(i−1), L4(i), L4(i+1), and
interconnect lines L5(j−1), L5(j), L5(j+1).

The odd interconnect lines from the side of the substrate 11, that is, the interconnect lines L1(j−1), L1(j), L1(j+1), the interconnect lines L3(j−1), L3(j), L3(j+1) and the interconnect lines L5(j−1), L5(j), L5(j+1) extend in the second direction.

The even interconnect lines from the side of the semiconductor substrate 11, that is, the interconnect lines L2(i−1), L2(i), L2(i+1) and the interconnect lines L4(i−1), L4(i), L4(i+1) extend in the first direction that intersects with the second direction. These interconnect lines are used as word lines or bit lines.

The lowermost first memory cell array M1 is disposed between the first interconnect lines L1(j−1), L1(j), L1(j+1) and the second interconnect lines L2(i−1), L2(i), L2(i+1). In the set/reset operations and read operation for the memory cell array M1, either the interconnect lines L1(j−1), L1(j), L1(j+1) or the interconnect lines L2(i−1), L2(i), L2(i+1) are used as word lines, and the other interconnect lines are used as bit lines.

The memory cell array M2 is disposed between the second interconnect lines L2(i−1), L2(i), L2(i+1) and the third interconnect lines L3(j−1), L3(j), L3(j+1). In the set/reset operations and read operation for the memory cell array M2, either the interconnect lines L2(i−1), L2(i), L2(i+1) or the interconnect lines L3(j−1), L3(j), L3(j+1) are used as word lines, and the other interconnect lines are used as bit lines.

The memory cell array M3 is disposed between the third interconnect lines L3(j−1), L3(j), L3(j+1) and the fourth interconnect lines L4(i−1), L4(i), L4(i+1). In the set/reset operations and read operation for the memory cell array M3, either the interconnect lines L3(j−1), L3(j), L3(j+1) or the interconnect lines L4(i−1), L4(i), L4(i+1) are used as word lines, and the other interconnect lines are used as bit lines.

The memory cell array M4 is disposed between the fourth interconnect lines L4(i−1), L4(i), L4(i+1) and the fifth interconnect lines L5(j−1), L5(j), L5(j+1). In the set/reset operations and read operation for the memory cell array M4, either the interconnect lines L4(i−1), L4(i), L4(i+1) or the interconnect lines L5(j−1), L5(j), L5(j+1) are used as word lines, and the other interconnect lines are used as bit lines.

Here, the cell units CU1, CU2, CU3, CU4 are respectively disposed at the place where the interconnect lines L1(j−1), L1(j), L1(j+1) intersect with the interconnect lines L2(i−1), L2(i), L2(i−1), at the place where the interconnect lines L2(i−1), L2(i), L2 (i+1) intersect with the interconnect lines L3(j−1), L3(j), L3(j+1), at the place where the interconnect lines L3(j−1), L3(j), L3(j+1) intersect with the interconnect lines L4(i−1), L4(i), L4(i+1), and at the place where the interconnect lines L4(i−1), L4(i), L4(i+1) intersect with the interconnect lines L5(j−1), L5(j), L5(j+1). That is, in the cross-point type memory cell array 2, the cell unit is disposed at the intersection of the interconnect lines stacked in succession in the third direction.

When two stacked memory cell arrays are isolated from each other in the respective layers by the insulating film, the interconnect lines are not shared by the two stacked memory cell arrays, and interconnect lines as word lines and bit lines are provided for each memory cell array in each layer.

Figure 3:
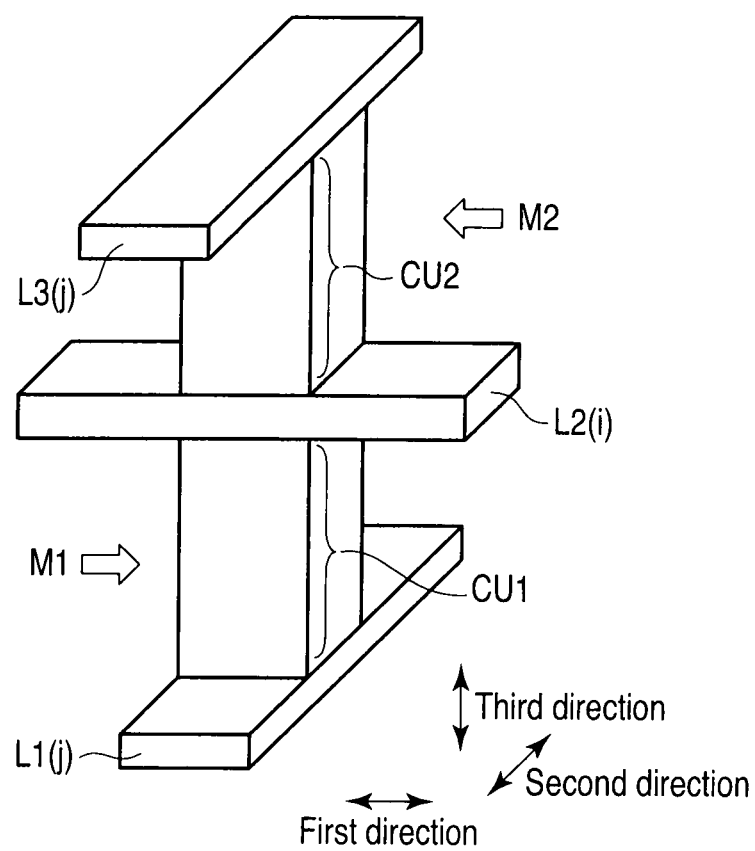
FIG. 3 is a diagram showing an example of the configuration of cell units of the memory cell array in FIG. 2.

FIG. 3 shows one example of the structures of the interconnect lines and the cell units in the cross-point type memory cell array.

Here, the cell units CU1, CU2 in two memory cell arrays M1, M2 in FIG. 2 are shown. In this case, the cell units in the two memory cell arrays M3, M4 in FIG. 2 are the same in configuration as the cell units in two memory cell arrays M1, M2 in FIG. 2.

Each of the cell units CU1, CU2 is composed of a memory element and a non-ohmic element that are connected in series. For example, a rectification element is used for the non-ohmic element.

There are various patterns of the connection between the memory element and the rectification element as the non-ohmic element. However, all the cell units in one memory cell array need to be the same in the connection between the memory element and the rectification element.

Figure 4:
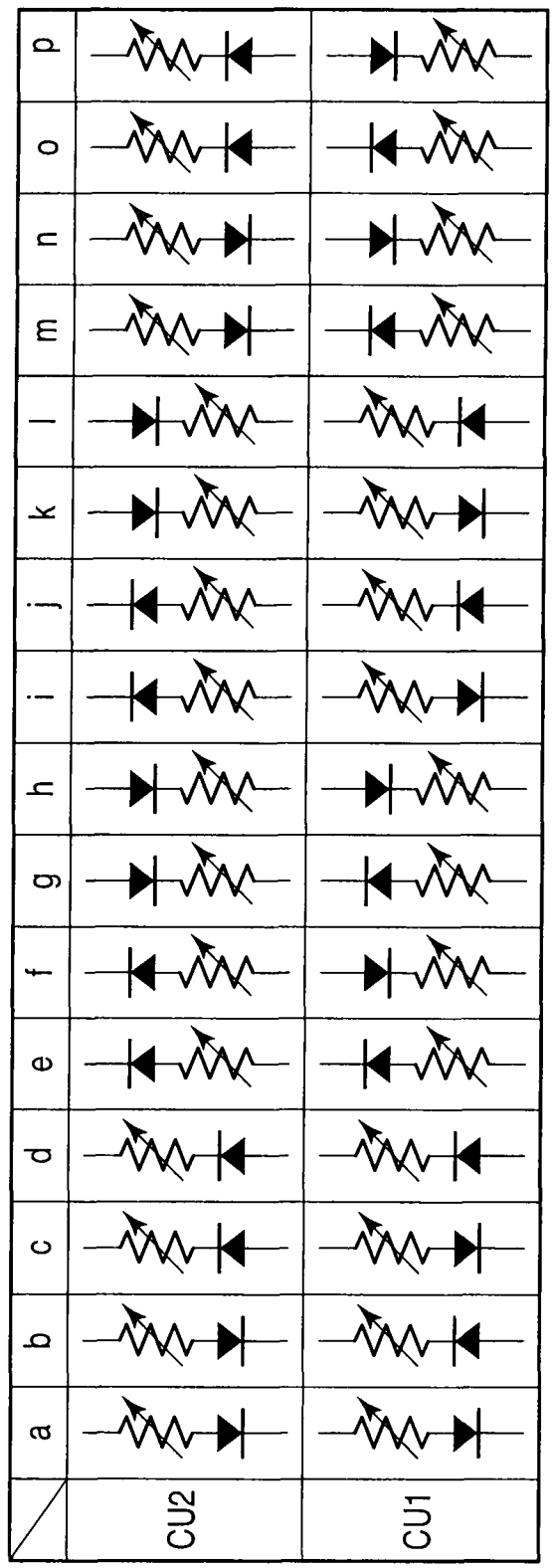
FIG. 4 is a diagram showing the connection between a memory element and a rectification element.

FIG. 4 shows the connection between the memory element and the rectification element.

In one cell unit, there are a total of four patterns of the connection between the memory element and the rectification element; two patterns of the positional relation between the memory element and the rectification element, and two patterns of the direction of the rectification element. Therefore, there are sixteen patterns (four patterns×four patterns) of the connection between the memory element and the rectification element regarding the cell units in two memory cell arrays.

a to p of FIG. 4 denote sixteen patterns of connection.

While the present embodiment is applicable to all of the sixteen patterns of connection, the connection of a of FIG. 4 is mainly described below by way of example.

Figure 5A:
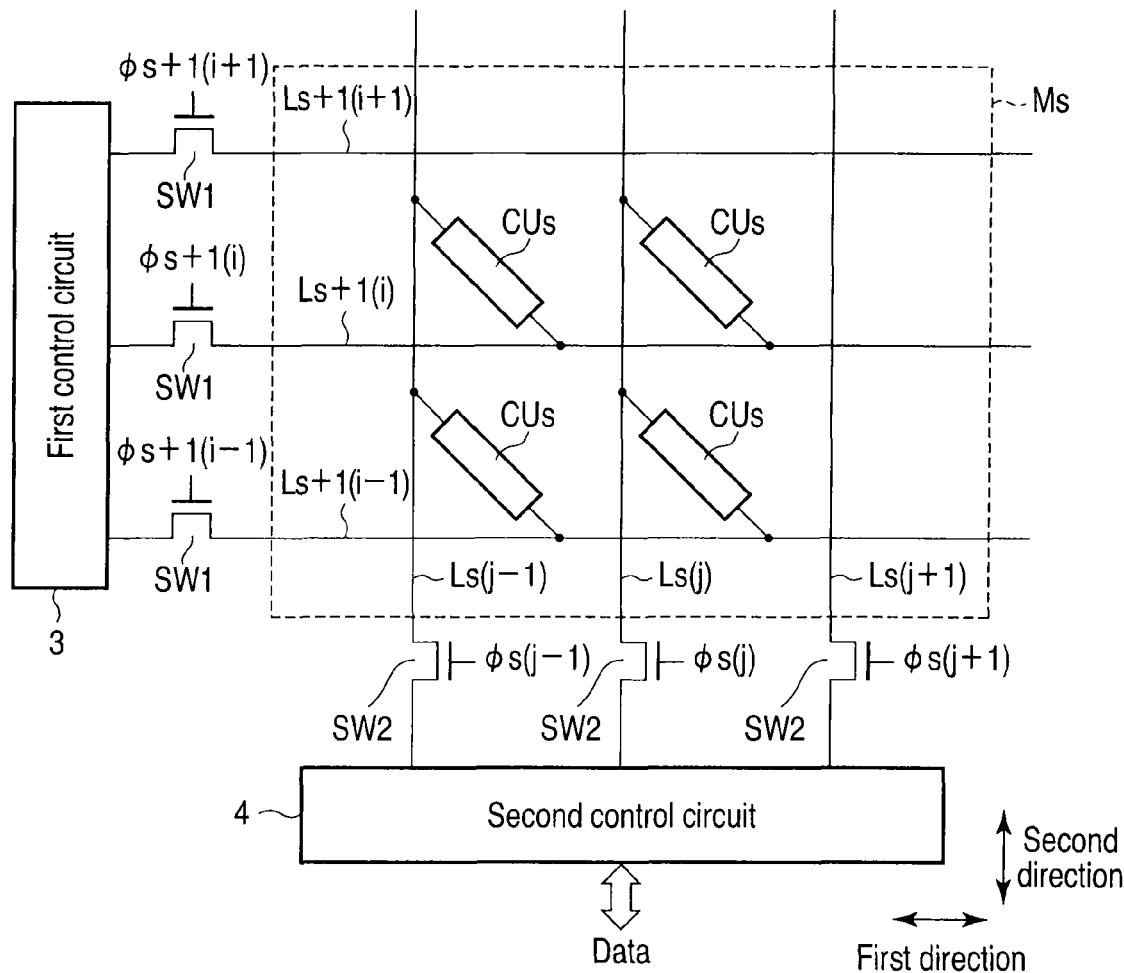
FIG. 5A is diagram showing the layout of first and second control circuits.

FIG. 5A and FIG. 5B show a first example of the layout of the first and second control circuits.

As shown in FIG. 5A, a memory cell array Ms is composed of a plurality of arrayed cell units CUs. The memory cell array Ms corresponds to one of the memory cell arrays M1, M2, M3, M4 shown in FIG. 2.

The cell units CUs are connected on one end to interconnect lines Ls(j−1), Ls(j), Ls(j+1), and connected on the other end to interconnect lines Ls+1(i−1), Ls+1(i), Ls+1(i+1).

As shown in FIG. 5B, a memory cell array Ms+1 is composed of a plurality of arrayed cell units CUs+1. The cell units CUs+1 are connected on one end to interconnect lines Ls+1 (i−1), Ls+1(i), Ls+1(i+1), and connected on the other end to interconnect lines Ls+2(j−1), Ls+2(j), Ls+2(j+1).

Here, s is 1, 3, 5, 7, . . .

The first control circuit 3 is connected to the interconnect lines Ls+1(i−1), Ls+1(i), Ls+1(i+1) on one end in the first direction via switch elements SW1. The switch elements SW1 are controlled by, for example, control signals φs+1(i−1), φs+1(i), φs+1(i+1). The switch element SW1 is configured by, for example, an N-channel field effect transistor (FET).

The second control circuit 4 is connected to the interconnect lines Ls(j−1), Ls(j), Ls(j+1) on one end in the second direction via switch elements SW2. The switch elements SW2 are controlled by, for example, control signals φs(j−1), φs(j), φs(j+1). The switch element SW2 is configured by, for example, an N-channel FET.

The second control circuit 4 is connected to the interconnect lines Ls+2(j−1), Ls+2(j), Ls+2(j+1) on one end in the second direction via switch elements SW2'. The switch elements SW2' are controlled by, for example, control signals φs+2(j−1), φs+2(j), φs+2(j+1). The switch element SW2' is configured by, for example, an N-channel FET.

Figure 6:
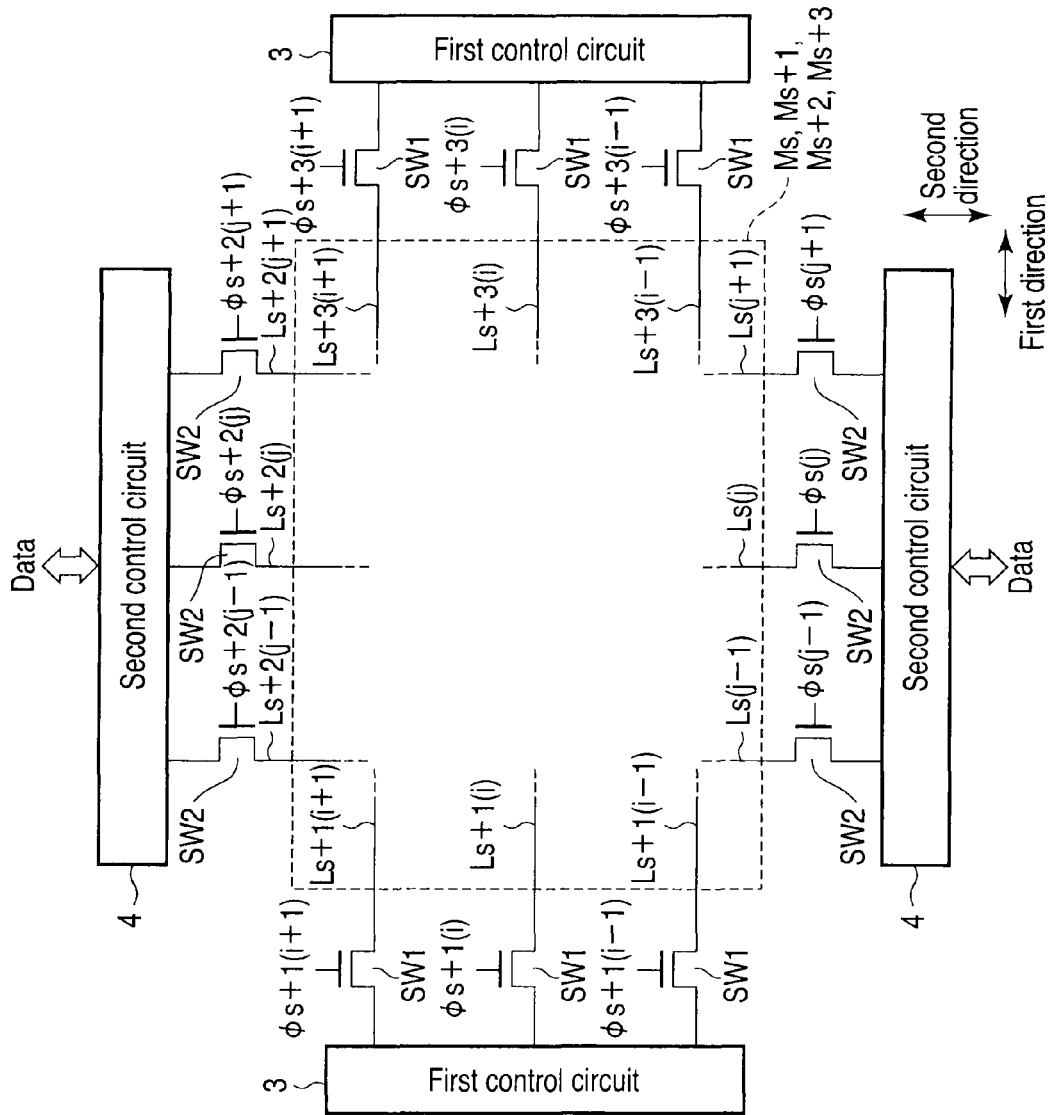
FIG. 6 is a diagram showing the layout of the first and second control circuits.

FIG. 6 shows a second example of the layout of the first and second control circuits. In addition, in FIG. 6, the internal configuration of the memory cell arrays Ms, Ms+1, Ms+2, Ms+3 is substantially the same as that of the memory cell array shown in FIG. 5A or FIG. 5B and is therefore not shown.

The layout in the second example is different from the layout in the first example in that the first control circuits 3 are disposed at both ends of the first direction of the memory cell array Ms, Ms+1, Ms+2, Ms+3 and in that second control circuits 4 are disposed at both ends of the second direction of the memory cell array Ms, Ms+1, Ms+2, Ms+3. Here, s is 1, 5, 9, 13, . . . .

The first control circuits 3 are connected to the interconnect lines Ls+1(i−1), Ls+1(i), Ls+1(i+1) on both ends in the first direction via the switch elements SW1. The switch elements SW1 are controlled by, for example, the control signals φs+1 (i−1), φs+1(i), φs+1(i+1), φs+3(i−1), φs+3(i), φs+3(i+1). The switch element SW1 is configured by, for example, an N-channel FET.

The second control circuits 4 are connected to the interconnect lines Ls(j−1), Ls(j), Ls(j+1) on both ends in the second direction via the switch elements SW2. The switch elements SW2 are controlled by, for example, the control signals φs(j−1), φs(j), φs(j+1), φs+2(j−1), φs+2(j), φs+2(j+1). The switch element SW2 is configured by, for example, an N-channel FET.

FIG. 7 is a bird's-eye view for illustrating the structure of the cell unit used in the resistance change memory according to the present embodiment.

As shown in FIG. 7, one cell unit CU is disposed at the intersection of two interconnect lines (the word line and the bit line) L2(i), L3(j). One cell unit CU is interposed between the two interconnect lines L2(i), L3(j).

In the cross-point type memory cell array 2, a current is only passed through a selected memory element, a memory element 20 and a non-ohmic element 30 are connected in series between the two interconnect lines.

In the cell unit CU in FIG. 7, the memory element 20 is stacked on the non-ohmic element 30, and a stack composed of the memory element and the non-ohmic element 30 is interposed as one cell unit CU between two interconnect lines L2(i), L3(j).

However, the structure of the cell unit CU shown in FIG. 7 is one example, and the non-ohmic element 30 may be stacked on the memory element 20 depending on the connection in the cell unit shown in FIG. 4.

The memory element 20 is a variable resistive element or a phase change element. Here, the term variable resistive element means an element made of a material with a resistance value that changes upon application of, for example, a voltage, a current or heat. The term phase change element means an element made of a material having physicality (impedance) such as a resistance value or capacitance that changes due to a crystal phase change by an application of energy such as a current.

The phase change (phase transition) includes the following:

Metal-semiconductor transition, metal-insulator transition, metal-metal transition, insulator-insulator transition, insulator-semiconductor transition, insulator-metal transition, semiconductor-semiconductor transition, semiconductor-metal transition, semiconductor-insulator transition Phase change of quantum state (e.g., metal-superconductor transition)

Paramagnet-ferromagnet transition, anti ferromagnet-ferromagnet transition, ferromagnet-ferromagnet transition, ferrimagnet-ferromagnet transition, or combination of the above transitions Paraelectric-ferromagnet transition, paraelectric-pyroelectric transition, paraelectric-piezoelectric transition, ferroelectric-ferroelectric transition, antiferroelectric-ferroelectric transition, or combination of the above transitions Combination of the above transitions For example, transition to a ferroelectric-ferromagnet from a metal, insulator, semiconductor, ferroelectric, paraelectric, pyroelectric, piezoelectric, ferromagnet, ferrimagnet, helimagnet, paramagnet or antiferromagnet, and reverse transition In accordance with the above definition, the variable resistive element includes the phase change element. In the present embodiment, the variable resistive element is mainly made of, for example, one of a metal oxide (e.g., a binary or ternary metal oxide), a metal compound, a chalcogenide material (e.g., Ge—Sb—Te, In—Sb—Te), an organic thin film, carbon, and carbon nanotube.

In addition, the resistance value of a magnetoresistive effect element used for a magnetoresistive RAM (MRAM) changes when the relative directions of the magnetizations of two magnetic layers constituting this element change. In the present embodiment, a magnetoresistive effect element such as a magnetic tunnel junction (MTJ) element is also included in the variable resistive element.

As a means of changing the resistance value of the memory element 20, there are an operation called a bipolar operation and an operation called a unipolar operation.

In the bipolar operation, the polarity of a voltage (current) applied to the memory element 20 is changed to cause a reversible change in the resistance value of the memory element 20 between at least a first value (first level) and a second value (second level).

In the unipolar operation, one or both of the intensity and application time (pulse width) of a voltage is controlled without changing the polarity of the voltage (current) applied to the memory element to cause a reversible change in the resistance value of the memory element between at least the first value and the second value.

The bipolar operation is used for a memory such as a spin-transfer type MRAM which requires bi-directional passage of a current through the memory element during writing.

The memory element 20 has electrode layers 25, 26 on one end and the other in the third direction (stacking direction). The electrode layer 25 is provided on the bottom of the memory element 20, and the electrode layer 26 is provided on the top of the memory element 20. The electrode layers 25, 26 are used as electrodes of the memory elements. The electrode layers 25, 26 are configured by one of, for example, a metal, alloy, metal compound or conductive semiconductor stack structures made of, or stack structure made of any two or more materials selected from the above materials.

In the memory element 20 according to the present embodiment, a portion interposed between two electrode layers 25, 26 is called a resistance change film 21. The resistance change film 21 is a film made of a material with a resistance value or crystal phase that changes upon application of, for example, a voltage, a current or heat.

The resistance change film 21 is made of a material having such a property that the film itself changes in the resistance value or crystal phase due to energy applied thereto. Otherwise, the resistance change film 21 may be made a material having such a property that the resistance value (or crystal phase) changes as a result of a characteristic change in the interface between the resistance change film 21 and the electrode layers 25, 26 due to energy applied thereto. In this case, the resistance value changing property of the memory element 20 may be determined by the combination of the material used for the resistance change film 21 and the material used for the electrode layers 25, 26.

The electrode layers 25, 26 may be used as diffusion preventing layers for preventing impurities derived from the non-ohmic element 30 located under the memory element 20 and derived from the interconnect line L3(j) from diffusing into the memory element 20. The electrode layers 25, 26 may also be used as adhesive layers for preventing the memory element 20 from being detached from the lower non-ohmic element 30 and the interconnect line L3(j).

In FIG. 7, the non-ohmic element 30 is an element having no linearity (ohmic property) in its input/output characteristics (e.g., current-voltage characteristics), that is, having a non-ohmic property.

The non-ohmic element 30 has conductive layers 35, 36 on one end and the other in the third direction (stacking direction). The conductive layer 35 is provided at the bottom of the non-ohmic element 30, and the conductive layer 36 is provided at the top of the non-ohmic element 30. The conductive layers 35, 36 are used as, for example, electrodes of the non-ohmic element 30. The conductive layers 35, 36 are configured by one of, for example, a metal, alloy, silicide or conductive semiconductor, or stack structure made of any two or more materials selected from the above materials.

In the memory element 20 and the non-ohmic element 30 constituting the cell unit CU, the conductive layers serving as the electrodes are provided on one end and the other end of each of the elements 20, 30. Thus, the conductive layers 25, 36 (e.g., the electrodes of the elements) intervene between the memory element 20 (resistance change film 21) and the non-ohmic element 30.

If the resistance change film 21 (e.g., a compound) of the memory element 20 is in direct contact with constituent members (e.g., a semiconductor layer) of the non-ohmic element 30, the memory element 20 and the non-ohmic element 30 may not come in ohmic contact, that is, the memory element 20 and the non-ohmic element 30 may come in non-ohmic contact. Otherwise, when the constituent members of the non-ohmic element 30 are in direct contact with the resistance change film 21, there may be a non-ohmic contact between the memory element 20 and the non-ohmic element 30, for example, due to the metal-oxide-semiconductor (MOS) structure or metal-insulator-semiconductor (MIS) structure formed by the constituent members and due to semiconductor-insulator junctions in the MOS structure and MIS structure.

In such cases, a current output by the non-ohmic element 30 is affected by the non-ohmic contact between the memory element 20 and the non-ohmic element 30 during the operation of the resistance change memory, so that a current having a predetermined pulse width or current value may not be supplied to the memory element.

As in the present embodiment, the conductive layers 35, 36 or electrode layer 25 is provided between the memory element 20 and the non-ohmic element 30, and the material of the conductive layers 35, 36 or electrode layer 25 is adjusted, such that an ohmic contact can be made between the non-ohmic element 30 and the memory element 20 (resistance change film 21). Ohmic contacts are also made between the non-ohmic element 30 and the conductive layers 35, 36 and between the non-ohmic element 30 and the electrode layer 25 between which the conductive layers 35, 36 intervene.

Thus, an ohmic property is ensured in the connection between the memory element 20 and the non-ohmic element 30 that are connected in series, and a predetermined current can be supplied to the memory element. As a result, the operating characteristics of the memory can be improved owing to the increased supply current, and the reliability of the resistance change memory can be improved.

The conductive layers (electrode layers) 25, 36 between the memory element 20 and the non-ohmic element 30 are not limited to the two layers 25, 36 that are provided in the respective elements, and one layer shared by the two elements 20, 30 may replace.

The non-ohmic element 30 has one of stack structures composed of a plurality of layers shown in FIG. 8A to 8C depending on the operating characteristics required for the configuration of the cell unit and the resistance change memory.

In the structure example shown in FIG. 8A, the non-ohmic element 30 is composed of two layers (films) 31, 32 sandwiched between two conductive layers (electrodes) 35, 36. The first layer 31 and the second layer 32 form a junction necessary for their output characteristics to demonstrate the non-ohmic property.

A non-ohmic element having such a two-layer structure may be, for example, a PN diode or a Schottky diode.

The PN diode is a diode in which a P-type semiconductor layer (anode layer) and an N-type semiconductor layer (cathode layer) form a PN junction. In this case, one of the two layers 31, 32 is the P-type semiconductor layer, and the other layer is the N-type semiconductor layer.

The Schottky diode is a diode in which a semiconductor layer and a metal layer form a Schottky junction. In this case, one of the two layers 31, 32 is the semiconductor layer, and the other layer is the metal layer.

In the structure example shown in FIG. 8B, the non-ohmic element 30 is composed of three layers (films) 31, 32, 33. The second layer 32 is sandwiched between the first layer 31 and the third layer 33. The three layers 31, 32, 33 form a junction necessary for their output characteristics to demonstrate the non-ohmic property.

A non-ohmic element 30 having such a three-layer structure may be, for example, a PIN diode or a metal-insulator-semiconductor (MIS) diode.

Examples of the structure of the non-ohmic element having a three-layer structure other than the diode include a semiconductor-insulator-semiconductor (SIS) structure and a metal-insulator-metal (MIM) structure.

The PIN diode is a diode having an intrinsic semiconductor layer between a P-type semiconductor layer (anode layer) and an N-type semiconductor layer (cathode layer). In this case, the layer 32 sandwiched between the two layers 31, 33 is the intrinsic semiconductor layer. One of the two layers 31, 33 is the P-type semiconductor layer, and the other layer is the N-type semiconductor layer. The intrinsic semiconductor layer may not only contain no N-type or P-type impurities but may also have an impurity concentration lower than that of the N-type and P-type semiconductor layers.

The MIS diode is a diode having an insulating layer between a metal layer and a semiconductor layer. In this case, the layer 32 sandwiched between the two layers 31, 33 is the insulating layer. One of the two layers 31, 33 is the semiconductor layer, and the other layer is the metal layer.

Moreover, in the MIM structure or SIS structure, both of the two layers 31, 33 are the metal layers or semiconductor layers, and the layer 32 sandwiched between the two layers 31, 33 is the insulating layer.

Another example of the non-ohmic element having the three-layer structure is a bipolar transistor type structure in which the semiconductor layer 32 of a different conductivity type is sandwiched between the two semiconductor layers 31, 33 of the same conductivity type.

In the structure example shown in FIG. 8C, the non-ohmic element 30 is composed of four layers 31, 32, 33, 34. The four layers 31, 32, 33, 34 form a junction necessary for their output characteristics to demonstrate the non-ohmic property.

A non-ohmic element 30 having such the four-layer structure as in FIG. 8C may be a semiconductor-metal-insulator-semiconductor (SMIS) diode. The SMIS diode has a structure in which a semiconductor layer is added to a MIS diode, and includes a metal layer and an insulating layer that are sandwiched between the two layers 31, 34. One of the two layers 32, 33 sandwiched between the two semiconductor layers 31, 34 is the metal layer, and the other layer is the insulating layer.

Another example of the non-ohmic element having the four-layer structure is a thyristor type structure. The thyristor type structure has alternately stacked P-conductivity-type and N-conductivity-type semiconductor layers.

It is preferable that in a resistance change memory driven via unipolar operation, the forward bias characteristics of the non-ohmic element are greatly different from the reverse bias characteristics of the non-ohmic element. Thus, in the unipolar type resistance change memory, a rectification element such as a diode is mainly used as the non-ohmic element 30.

It is preferable that in a resistance change memory driven via bipolar operation, the forward bias characteristics and reverse bias characteristics of the non-ohmic element are approximate line-symmetrically with respect to the current axis of I-V characteristics as an axis of symmetry. Thus, in the bipolar type resistance change memory, the MIM structure or SIS structure, or the bipolar transistor type structure is used as the non-ohmic element 30.

The above-mentioned bipolar transistor type structure and thyristor type structure only show the stacking order of the P-type and N-type semiconductor layers, and do not limit the thickness of the semiconductor layers, the impurity concentration and the element operation.

In the present embodiment, a resistance change memory that utilizes the unipolar operation is mainly described. However, it goes without saying that the resistance change memory in the embodiment may be a memory that utilizes the bipolar operation.

When a resistance change memory having a cross-point type memory cell array (hereinafter referred to as a cross-point type resistance change memory) is driven by the unipolar operation, the following characteristics are required for the rectification element 30 as a non-ohmic element in order to accurately perform the set/reset operations and read operation: a current (forward current) is high when a forward bias is applied, and a current (reverse current) is low and a breakdown voltage is high when a reverse bias is applied.

In the resistance change memory according to the present embodiment, the non-ohmic element 30 to constitute the cell unit has a silicon germanium region (hereinafter referred to as an SiGe region) 39.

The SiGe region 39 is provided between two conductive layers 35, 36 in the non-ohmic element 30. In the SiGe region 39, the composition ratio of Ge to Si is more than 0 atomic % and 30 atomic % or less.

Furthermore, the non-ohmic element 30 has, for example, a portion (referred to as a silicon portion) 37 containing silicon as the main component, as a portion (semiconductor layer) of a semiconductor that constitutes this element. Depending on the element structures described with FIG. 8A to FIG. 8C, the whole portion between the two conductive layers 35, 36 may be the silicon portion (semiconductor portion), or a portion between the two conductive layers 35, 36 may be partly the silicon portion.

The silicon portion 37 is constituted of one silicon layer or two or more silicon layers.

The silicon portion 37 may contain a donor impurity (phosphorus or arsenic) to provide silicon with N-type conductivity or may contain an acceptor impurity (boron) to provide silicon with P-type conductivity. However, the silicon portion 37 may contain neither the donor impurity nor the acceptor impurity, that is, may be intrinsic silicon.

The silicon portion 37 is, for example, a polysilicon layer or a monocrystalline silicon layer. Such a crystallized silicon layer is formed by crystallizing amorphous silicon through a heat treatment.

The SiGe region 39 is, for example, provided in the silicon portion 37. In the non-ohmic element 30, a portion in the silicon portion 37 may be the SiGe region 39, or the whole silicon portion 37 may be the SiGe region 39. In addition, for example, an atomic-layer-level thin germanium layer (hereinafter referred to as a Ge layer) may be provided in the SiGe region 39.

In general, when polysilicon is used for the silicon portion 37 included in the non-ohmic element made of silicon, for example, the PIN diode, surface morphology (surface roughness) of polysilicon is rough if polysilicon is deposited on a certain layer.

If the size (dimension) of the non-ohmic element 30 is smaller, the effect of the morphological roughness is more obvious, and the steepness of the junction of the polysilicon layer and the other member (e.g., a silicide layer) is impaired.

As a result, the characteristics of the non-ohmic element 30, for example, the forward/reverse bias characteristics of the diode deteriorate.

On the contrary, there is a method to form polysilicon by depositing amorphous silicon on a given layer and crystallizing amorphous silicon through a heat treatment. However, even in this method, amorphous silicon is not easily crystallized if the area of amorphous silicon viewed from the third direction and the thickness of amorphous silicon in the third direction are decreased due to the miniaturization of the element.

The reasons are as follows:

For amorphous silicon to be crystallized, it is preferable that a great number of crystal nuclei (e.g., silicon) be contained in the amorphous silicon film. However, if the area or volume of the amorphous silicon film is smaller, the probability of the presence of the crystal nuclei contained in the amorphous silicon film is lower.

Therefore, if the element size of the cell unit is smaller, amorphous silicon is more difficult to be crystallized into polysilicon by the heating temperature and heating time that are used for a greater size of the element.

As a result, the silicon layers constituting the non-ohmic element are insufficiently crystallized, and there are more crystal faults and crystal grain boundaries in the silicon layers. Even if polysilicon is formed from amorphous silicon by a long-time heat treatment, there are in this case problems of the thermal diffusion of impurities contained in the silicon layers and a thermal load on other elements.

Thus, in a conventional resistance change memory, characteristics of the non-ohmic element deteriorate along with the miniaturization of the element; for example, a reduced forward current of the non-ohmic element during the application of a forward bias, an increased reverse current during the application of a reverse bias, or a reduced breakdown voltage of the non-ohmic element.

Furthermore, due to the non-crystallization of amorphous silicon, the silicon layer may be an insulator or may lose conductivity, and a non-ohmic element driven by a predetermined operation may not be formed.

As a result, according to the conventional resistance change memory, not only the improvement of the crystallinity of the silicon layer as a constituent member but also the miniaturization of the element is difficult.

In order to address this problem, the SiGe (silicon germanium) region 39 is provided in the non-ohmic element 30 in the resistance change memory according to the embodiment of the present embodiment. The SiGe region 39 is provided in the silicon portion 37 of the non-ohmic element 30.

The SiGe region 39 is inserted in situ during the formation of the silicon portion 37, or is formed by a heat treatment or by a chemical reaction between silicon and germanium added to the silicon portion 37. Germanium may be added to the silicon portion 37 by ion implantation or by the in-situ insertion of germanium as a Ge (germanium) layer during the formation of the silicon portion 37.

The SiGe region 39 accelerates the crystallization of amorphous silicon into polysilicon. This is attributed to the contribution of germanium atoms in the SiGe region 39 or the silicon portion 37 to the crystallization of amorphous silicon in the following manner.

Owing to the addition of germanium to the silicon portion 37, the quantity of heat necessary for the crystallization of amorphous silicon into polysilicon substantially decreases.

During the heat treatment for the crystallization of amorphous silicon, germanium in the silicon portion 37 tends to become a crystal nucleus for the crystallization of silicon.

During the heat treatment for the crystallization, the crystal growth of silicon is encouraged by the recrystallization (e.g., solid-phase epitaxial growth) of silicon reflecting the crystal face (crystal orientation) of silicon germanium.

For such reasons, when a silicon layer (silicon portion) having a thickness of, for example, 150 nm or less is used for the cell unit, the crystallization of amorphous silicon is accelerated without any high-temperature or long-time heat treatment(s) and polysilicon having improved crystallinity is formed from amorphous silicon even if the diameter or dimension of a cell in a direction level with the substrate surface is reduced to 100 nm or less (e.g., an area of 10000 $nm^2$ or less).

That is to say, according to the resistance change memory in the present embodiment, under the miniaturization of the element in progress, crystal faults and crystal grain boundaries in the silicon layers constituting the non-ohmic element are reduced, and characteristic deterioration of the non-ohmic element due to insufficient crystallization can be prevented.

Thus, according to the resistance change memory in the present embodiment, the crystallinity of the silicon layer (silicon portion) included in the non-ohmic element 30 is improved, so that deterioration of the forward bias characteristics/reverse bias characteristics of the non-ohmic element is inhibited.

Furthermore, lattice distortion of silicon germanium improves the mobility of electrons (carriers) moving in the SiGe region 39 from the silicon layer. The intensity of the current running through the semiconductor layer is proportional to the mobility of electrons. Thus, the SiGe region 39 is provided in the silicon portion 37 (the current path of the element), so that an output current (forward current) of the non-ohmic element during the application of a forward bias increases. Therefore, the non-ohmic element 30 having the SiGe region 39 can supply the memory element 20 with a sufficient intensity of a forward current for a selected cell unit to perform the set/reset operations.

In addition, according to the resistance change memory in the present embodiment, a high-temperature/long-time heat treatment can be reduced, so that a thermal load resulting from the heat treatment for the crystallization of amorphous silicon can be reduced.

Especially in the case of the cross-point type memory cell array shown in FIG. 2, a plurality of memory cell arrays are stacked, and are arranged, via the interlayer insulating film (substrate 11), above the silicon substrate where the elements (e.g., an FET) are formed.

Under the advancing miniaturization of the cell unit, the conventional resistance change memory requires the increase in the temperature of the heat treatment, the increase in the time for the heat treatment and the increase in the number of times of the heat treatment in order to crystallize amorphous silicon into polysilicon. As a result, a great thermal load is given to the element formed on the silicon substrate and to the memory elements and non-ohmic elements formed in the memory cell arrays.

In contrast, according to the resistance change memory in the present embodiment, a high-quality polysilicon layer can be relatively easily formed from an amorphous silicon layer even if the miniaturization of the element has made progress. Thus, the heat treatment for the crystallization of amorphous silicon has reduced adverse effects on the elements formed on the silicon substrate and the non-ohmic element and memory element formed in the memory cell array.

As described above, the resistance change memory according to the embodiment of the present embodiment enables element miniaturization and the reduction of element characteristic deterioration.

(3) Structure Example

A more specific structure example of the non-ohmic element of the resistance change memory according to the present embodiment is described with FIG. 9A to FIG. 9S. FIG. 9A to FIG. 9S show sectional structures of the non-ohmic element 30. In FIG. 9A to FIG. 9S, the conductive layer 35 side is referred to as the lower side of the element, and the conductive layer 36 side is referred to as the upper side of the element. It goes without saying that the non-ohmic element is upside-down depending the configuration of the cell unit shown in FIG. 4.

Here, a PIN diode is shown as an example of the non-ohmic element, and the structure of the PIN diode including an SiGe region is described.

Hereinafter, a P-type silicon layer of the PIN diode is referred to as a P layer, an N-type silicon layer of the PIN diode is referred to as an N layer, and an intrinsic silicon layer between the P layer and the N layer is referred to as an I layer. For example, the N layer and P layer has a concentration of impurity more than $1 \times 10^{17}$ cm$^{-3}$.

In FIG. 9A to FIG. 9S, the P layer 33 contains, for example, boron (B) as an acceptor-type impurity. The thickness of the P layer 33 is, for example, about 1 nm to 30 nm.

The N layer 31 contains, for example, at least one of arsenic (As) and phosphorus (P) as a donor-type impurity. The thickness of the N layer 31 is, for example, about 1 nm to 30 nm.

Furthermore, the thickness of the I layer 32 is, for example, about 20 nm to 100 nm.

In FIG. 9A to FIG. 9S, nineteen kinds of non-ohmic elements are shown.

As shown in the element structure of FIG. 9A, a SiGe region $39_1$ is provided in the I layer 32 of the PIN diode. The SiGe region $39_1$ is sandwiched between two regions $38_1$, $38_2$ in the I layer 32 in the stacking direction (third direction) of the layers. The SiGe region $39_1$ is in contact with neither the N layer 31 nor the P layer 33. The regions $38_1$, $38_2$ in the I layer 32 are, for example, polysilicon regions (hereinafter referred to as Si regions). The thickness of the SiGe region $39_1$ in the I layer 32 is, for example, about 10 nm to 30 nm.

In the structure of the PIN diode shown in FIG. 9A, amorphous silicon is crystallized around the SiGe region $39_1$ toward both the P layer and the N layer addition form the conductive layer (silicide layer) 35, 36 contacting to the diode 37, which is effective in the acceleration of the crystal growth. Moreover, the SiGe region $39_1$ is provided in the center of the I layer 32, so that the Si regions $38_1$, $38_2$ in the I layer 32, the N layer 31 and the P layer 33 can be formed with substantially uniform crystallinity.

Furthermore, the SiGe region $39_1$ is sandwiched between two Si regions $38_1$, $38_2$, so that the mobility of electrons (carriers) which have moved into the SiGe region $39_1$ from the silicon layer due to the lattice distortion of the SiGe region $39_1$ is improved. The intensity of the current running through semiconductor (silicon) is proportional to the mobility of electrons. Thus, as in FIG. 9A, the forward current of the PIN diode 30 can be increased owing to the structure in which the SiGe region $39_1$ is sandwiched between two Si regions $38_1$, $38_2$.

The effect of the lattice distortion of the SiGe region $39_1$ is not limited to the case where the SiGe region $39_1$ is sandwiched between the Si regions $38_1$, $38_2$ in the I layer 32, and is also obtained in a structure in which the SiGe region $39_1$ is sandwiched between N-type and P-type silicon layers, for example, between the N layer 31 and the P layer 33.

For example, an atomic-layer-level thin Ge layer may be provided in the SiGe region $39_1$.

As shown in the element structure of FIG. 9B, the SiGe region $39_1$ is provided on the P layer side in the I layer 32, and an interface is formed between the SiGe region $39_1$ and the P layer 33. The Si region $38_1$ intervenes between the SiGe region $39_1$ and the N layer 31, and the SiGe region $39_1$ is not in contact with the N layer 31.

The electric property of the PIN diode, in particular, an output current during the application of a forward bias (hereinafter referred to as a forward current) depends on the intensity of electric resistance produced between two layers (hereinafter referred to as interface resistance). If the interface resistance is higher, the upper limit value of the forward current of the diode is lower. The intensity of the interface resistance is subject to the size of the band gap of a semiconductor.

The size of the band gap of silicon germanium is smaller than the size of the band gap of silicon.

Therefore, as in the structure shown in FIG. 9B, when the SiGe region $39_1$ forms an interface with the P layer (P-type silicon layer), the height of a barrier produced at the interface between the SiGe region $39_1$ and the P layer 33 is smaller than the height of a barrier produced at the interface where the I layer (intrinsic silicon layer) and the P layer 33 are in direct contact. As a result, the interface resistance between the P layer 33 and the I layer 32 can be reduced.

Thus, as in the structure of FIG. 9B, the PIN diode in which the P layer 33 and the SiGe region $39_1$ form an interface can improve its forward bias characteristics and output a high forward current. In addition, as long as the P layer 33 and the SiGe region $39_1$ form an interface, effects similar to the effects obtained by the PIN diode of FIG. 9B can be obtained in non-ohmic elements having other structures such as a MIS diode or PIM diode.

In the element structure of FIG. 9C, as opposed to the structure of FIG. 9B, the SiGe region $39_1$ is provided on the N layer side in the I layer 32 and forms an interface with the N layer 31. The SiGe region $39_1$ is not in contact with the P layer 33 due to the silicon region $38_2$.

In the element structure of FIG. 9D, the SiGe region $39p$ is provided in the P layer 33. In the structure of FIG. 9D, the SiGe regions are not provided in the N layer 31 and the I layer 32.

The whole P layer 33 of the structure of FIG. 9D may be a SiGe region $39p$. Moreover, part of the P layer 33 on the I layer side may be the SiGe region $39p$. In this case, regions of the P layer 33 other than the SiGe region $39p$ are made of P-type silicon (e.g., polysilicon). The SiGe region $39_1$ provided in the P layer 33 contains boron, and is made of P-type silicon germanium. This holds true with later-described other element structures in which the SiGe region is provided in the P layer 33 similarly to FIG. 9D.

When the SiGe region $39_1$ is provided in the P layer 33, that is, the P layer 33 is made of silicon germanium, boron (acceptor impurity) contained in the P layer 33 is activated by the addition of germanium.

The activation of boron enables the reduction of the interface resistance between the P layer 33 (SiGe region $39p$) and the I layer 32 and the interface resistance between the P layer 33 and the conductive layer (silicide layer) 36.

Thus, a high forward current can be output when a forward bias is applied to the PIN diode 30.

Furthermore, germanium contained in the SiGe region $39p$ tends to inhibit the diffusion of boron. As a result, in the PIN diode as the non-ohmic element 30, the substantial dimension (thickness) of the I layer 32 is inhibited from decreasing due to the diffusion of boron into the I layer 32.

As a result, when a reverse bias is applied to the PIN diode, the band structure of the I layer 32 is less bent, and tunneling of electrons between bands can be inhibited.

Thus, an output current during the application of the reverse bias to the PIN diode (non-ohmic element) 30 (hereinafter referred to as a reverse current) can be reduced.

Such an effect whereby the SiGe region inhibits the diffusion of boron is also obtained in a structure in which the SiGe region $39_1$ is provided in the I layer 32 adjacently to the P layer 33 as in the structure of FIG. 9B.

As shown in the element structure of FIG. 9E, the SiGe region $39_1$ is provided on part of the I layer 32 on the P layer side. In the P layer 33 as well, the P-type SiGe region 39$p$ is provided.

The whole P layer 33 may be the SiGe region 39$p$, or part of the P layer 33 on the I layer side may be the SiGe region 39$p$. Moreover, regions in the I layer 32 except for the SiGe region $39_1$ are made of intrinsic silicon.

Thus, in the PIN diode having the structure of FIG. 9E, the SiGe regions $39_1$, 39$p$ extend over the I layer 32 and the P layer 33. However, it goes without saying that there are differences between the I layer 32 and the P layer 33 in the kind of impurities contained in the SiGe regions $39_1$, 39$p$ and in the concentration of the impurities. That is, the SiGe region $39_1$ in the I layer 32 is made of intrinsic silicon germanium, and the SiGe region 39$p$ in the P layer 33 is made of P-type silicon germanium, and the conductivity types of the two SiGe regions $39_1$, $39_p$ are inconsecutive.

The PIN diode having the structure of FIG. 9E has both of the effects of the structures of FIG. 9B and FIG. 9D, and enables the increase of the forward current and the decrease of the reverse current.

In the structure of FIG. 9F, the SiGe region 39$p$ is provided in the P layer 33, and a SiGe region 39$n$ is provided in the N layer 31. The SiGe region is not provided in the I layer 32. The SiGe region 39$n$ in the N layer 31 contains arsenic (As) or phosphorus (P), and is N-type silicon germanium.

Furthermore, as shown in the structure of FIG. 9G, the SiGe region 39$n$ may be provided in the N layer 31 alone. In this structure, the whole N layer 31 may be a SiGe region, or part of the N layer 31 may be a SiGe region. This holds true with the later-described structure in which the SiGe region is provided in the N layer 31 similarly to FIG. 9G. However, parts of the N layer 31 other than the SiGe region 39$n$ are made of N-type silicon (e.g., polysilicon).

In the structure of the PIN diode (non-ohmic element) shown in FIG. 9H, as opposed to the structure of FIG. 9D, the SiGe region $39_1$ is provided on the N layer side in the I layer 32, and the SiGe region 39$n$ is provided in the N layer 31.

As shown in the structure of FIG. 9I, all of the layers 31, 32, 33 that constitute the PIN diode may be the SiGe regions 39$n$, $39_1$, 39$p$. In this case, the N layer 31 is made of N-type silicon germanium, the P layer 33 is made of P-type silicon germanium, and the I layer 32 is made of intrinsic silicon germanium.

In the structure of FIG. 9J, the whole I layer 32 from the P layer side to the N layer side is formed of the SiGe region $39_1$. The whole P layer 33 or part of the P layer 33 also contains the SiGe region 39$p$.

In the element structure shown in FIG. 9K, the whole I layer 32 from the P layer side to the N layer side is formed of the SiGe region $39_1$. The whole N layer 31 or part of the P layer 31 contains the SiGe region 39$n$.

In the element structure shown in FIG. 9L, the SiGe region $39_1$ is provided in the whole I layer 32 of the PIN diode. The SiGe regions are not provided in the N layer 31 and the P layer 33.

In the element structure shown in FIG. 9M, the SiGe region $39_1$ is provided in the I layer 32 without being in contact with the N layer 31 and the P layer 33, as in the structure of FIG. 9A. Moreover, in the element structure of FIG. 9M, the SiGe region 39$p$ is provided in the whole P layer 33 or part of the P layer 33.

In the element structure of the PIN diode (non-ohmic element) 30 shown in FIG. 9N, the SiGe region $39_1$ is provided in the I layer 32 without being in contact with the N layer 31 and the P layer 33, and the SiGe region 39$n$ is provided in the whole N layer 31 or part of the N layer 31.

As shown in the element structure of FIG. 9O, the SiGe region $39_1$ is provided in the I layer 32 without being in contact with the N layer 31 and the P layer 33. The SiGe region 39$n$ is provided in the whole N layer 31 or part of the N layer 31. The SiGe region 39$p$ is provided in the whole P layer 33 or part of the P layer 33.

In the PIN diode having the structure shown in FIG. 9P, the SiGe region $39_1$ is provided on the N layer side of the I layer 32, and a SiGe region $39_2$ is provided on the P layer side in the I layer 32. The N layer 31 forms an interface with the SiGe region $39_1$, and the P layer 33 forms an interface with the SiGe region $39_2$.

In the PIN diode having the structure shown in FIG. 9P, a silicon region 38 is sandwiched between two SiGe regions $39_1$, $39_2$ in the I layer 32.

In the element structure of FIG. 9Q, the SiGe layers $39_1$, $39_2$ are provided at both ends of the I layer 32 on the P layer side and N layer side. Moreover, in the structure of FIG. 9Q, the P-type SiGe region 39$p$ is provided in the whole P layer 33 or part of the P layer 33.

On the other hand, in the structure of FIG. 9R, the SiGe layers $39_1$, $39_2$ are provided on the P layer side and N layer side of the I layer 32, and the N-type SiGe region 39$n$ is provided in the whole N layer 31 or part of the N layer 31.

In the structure of FIG. 9S, the SiGe layers $39_1$, $39_2$ are provided on the P layer side and N layer side in the I layer 32. Moreover, the N-type SiGe region 39$n$ is provided in the N layer 31, and the P-type SiGe region 39$p$ is provided in the P layer 33.

Although nineteen kinds of structures of the non-ohmic elements (PIN diodes) are shown in FIG. 9A to FIG. 9S, typical examples have been only shown here. As long as the non-ohmic element in which an SiGe region is provided in a silicon portion for the acceleration of crystallization, even structures other than the structures shown in FIG. 9A to FIG. 9S are included in the resistance change memory according to the embodiment of the present embodiment.

Furthermore, the present embodiment is not limited to the PIN diodes shown here by way of example. In the case of a non-ohmic element including a silicon layer such as a PN diode, a MIS diode, SIS diode or PIM diode, the SiGe region can be provided in the non-ohmic elements having the other structures shown in FIG. 8A to FIG. 8C. It goes without saying that effects similar to the above-mentioned effects can also be obtained in such elements.

As shown in FIG. 9A to FIG. 9S, the SiGe regions $39_1$, $39_2$ are provided in the silicon portions (silicon layers) constituting the non-ohmic element.

Thus, when polysilicon is formed by the crystallization of amorphous silicon through a heat treatment in the resistance change memory according to the present embodiment, the crystallization of amorphous silicon can be accelerated even if the size of the element (e.g., the area of amorphous silicon viewed from the third direction and the thickness of amorphous silicon in the third direction) is smaller.

Thus, in the resistance change memory according to the present embodiment, the crystallinity of formed polysilicon is improved, and characteristic deterioration of the non-ohmic element due to the insufficient crystallization can be inhibited.

Consequently, the resistance change memory according to the embodiment of the present embodiment enables element miniaturization and the inhibition of element characteristic deterioration.

(4) Operation

Figure 10:
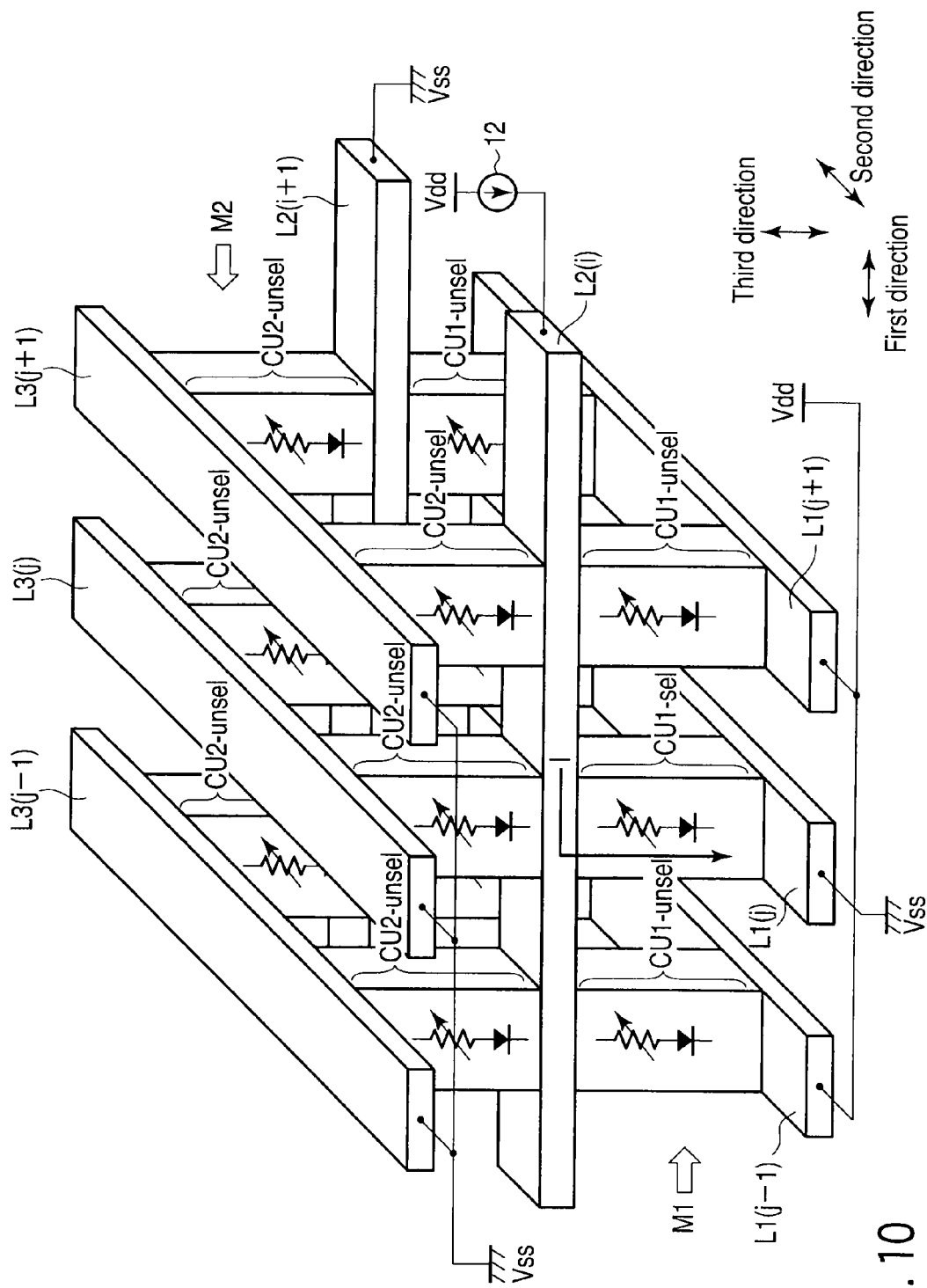
FIG. 10 is a diagram for illustrating an example of the operation of the resistance change memory according to the embodiment.

The operation of the resistance change memory according to the embodiment of the present embodiment is described with FIG. 10.

FIG. 10 shows two memory cell arrays.

A memory cell array M1 corresponds to the memory cell array M1 shown in FIG. 2, and a memory cell array M2 corresponds to the memory cell array M2 shown in FIG. 2. The connection between the memory element and the non-ohmic element (e.g., a rectification element) in the cell unit CU1, CU2 corresponds to a of FIG. 4.

A. Set Operation

First described is the case where a writing (set) operation is performed on a selected cell unit CU1-sel in the memory cell array M1.

The initial state of the selected cell unit CU1-sel is an erased (reset) state.

For example, the reset state is a high-resistance state (100 kΩ to 1 MΩ), and the set state is a low-resistance state (1 kΩ to 10 kΩ).

A selected interconnect line L2($i$) is connected to a high-potential-side power supply potential Vdd, and a selected interconnect line L1($j$) is connected to a low-potential-side power supply potential Vss (e.g., a ground potential).

Among first interconnect lines from the substrate side, unselected interconnect lines L1($j$−1), L1($j$+1) other than the selected interconnect line L1($j$) are connected to the power supply potential Vdd. Among second interconnect lines from the substrate side, an unselected interconnect lines L2($i$+1) other than the selected interconnect line L2($i$) are connected to the power supply potential Vss.

Furthermore, third unselected interconnect lines L3($j$−1), L3($j$), L3($j$+1) from the substrate side are connected to the power supply potential Vss.

In this case, a forward bias is applied to the rectification element (e.g., a diode) in the selected cell unit CU1-sel. Thus, a set current I-set from a constant current source 12 runs through the selected cell unit CU1-sel, and the resistance value of the memory element in the selected cell unit CU1-sel changes from the high-resistance state to the low-resistance state.

Here, in the set operation, a voltage of, for example, about 3 V to 6 V is applied to the memory element in the selected cell unit CU1-sel during a period (pulse width) of about 10 ns to 100 ns. The set current I-set passed through the memory element (high-resistance state) is, for example, about 10 nA, and the density of this current is set at a value ranging from $1 \times 10^5$ to $1 \times 10^7$ A/cm$^2$.

On the other hand, a reverse bias is applied to the rectification element (diode) in the cell unit which is connected between the unselected interconnect lines L1($j$−1), L1($j$+1) and the unselected interconnect line L2($i$+1), among the unselected cell units CU1-unsel in the memory cell array M1.

Similarly, a reverse bias is applied to the rectification element (diode) in the cell unit which is connected between the selected interconnect line L2($i$) and the unselected interconnect lines L3($j$−1), L3($j$), L3($j$+1), among unselected cell units CU2-unsel in the memory cell array M2.

In addition, the inter-terminal potential difference of the non-ohmic element (diode) in the cell unit which is connected between the selected interconnect line L2($i$) and the unselected interconnect lines L1($j$−1), L1($j$+1) is set at substantially zero (Vdd-Vdd). Similarly, the inter-terminal potential difference of the non-ohmic element (diode) in the cell unit which is connected between a unselected interconnect lines L3($j$−1), L3($j$), L3($j$+1) and the unselected interconnect line L2($i$+1) is set at substantially zero (Vss-Vss).

B. Reset Operation

Next described is the case where an erasing (reset) operation is performed on the selected cell unit CU1-sel in the memory cell array M1.

A selected interconnect line L2($i$) is connected to the high-potential-side power supply potential Vdd, and a selected interconnect line L1($j$) is connected to the low-potential-side power supply potential Vss.

Among the first interconnect lines from the substrate side, unselected interconnect lines L1($j$−1), L1($j$+1) other than the selected interconnect line L1($j$) are connected to the power supply potential Vdd. Among the second interconnect lines from the substrate side, an unselected interconnect lines L2($i$+1) other than the selected interconnect line L2($i$) are connected to the power supply potential Vss.

Furthermore, the third unselected interconnect lines L3($j$−1), L3($j$), L3($j$+1) from the substrate side are connected to the power supply potential Vss.

In this case, a forward bias is applied to the rectification element (e.g., a diode) in the selected cell unit CU1-sel. Thus, a reset current I-reset from the constant current source 12 runs through the selected cell unit CU1-sel, and the resistance value of the memory element in the selected cell unit CU1-sel changes from the low-resistance state to the high-resistance state.

Here, in the reset operation, a voltage of about 0.5 V to 3 V is applied to the memory element in the selected cell unit CU1-sel during a period (pulse width) of about 200 ns to 1 µs. The reset current I-reset passed through the memory element (low-resistance state) is about 1 µA to 100 µA, and the density of this current is set at a value ranging, for example, from $1 \times 10^3$ to $1 \times 10^6$ A/cm$^2$.

On the other hand, a reverse bias is applied to the rectification element (diode) in the cell unit which is connected between the unselected interconnect lines L1($j$−1), L1($j$+1) and the unselected interconnect line L2($i$+1), among the unselected cell units CU1-unsel in the memory cell array M1.

Similarly, a reverse bias is applied to the rectification element (diode) in the cell unit which is connected between the selected interconnect line L2($i$) and the unselected interconnect lines L3($j$−1), L3($j$), L3($j$+1), among the unselected cell units CU2-unsel in the memory cell array M2.

In addition, the inter-terminal potential difference of the non-ohmic element (diode) in the cell unit which is connected between the selected interconnect line L2($i$) and the unselected interconnect lines L1($j$−1), L1($j$+1) is set at substantially zero (Vdd-Vdd). Similarly, the inter-terminal potential difference of the non-ohmic element (diode) in the cell unit which is connected between a unselected interconnect lines L3($j$−1), L3($j$), L3($j$+1), and the unselected interconnect line L2($i$+1) is set at substantially zero (Vss-Vss).

In addition, the value of the set current I-set and the value of the reset current I-reset are different from each other. Moreover, when the set/reset operation of the memory element depends on the pulse width of the current/voltage, the pulse width of the set current and the pulse width of the reset current are different from each other. The value/period (pulse width) of the voltage (current) applied to the memory element in the selected cell unit CU1-sel for generating these currents depends on the materials constituting the memory element.

In the set/reset operation, a potential higher than the low-potential-side power supply potential Vss may be applied to an unselected interconnect line connected to an unselected cell unit to charge this interconnect line for the next operation in the case of a configuration that has a connection whereby a predetermined potential difference can be applied to a selected cell unit and whereby a reverse bias can be applied to the unselected cell unit or the unselected cell unit can be set at the same potential, among the configurations of the stacked cell units shown in a to p of FIG. 4. This makes it possible to reduce the time for charging the interconnect lines in the next operation and increase the operation speed of the memory.

C. Read Operation

Next described is the case where a read operation is performed on the selected cell unit CU1-sel in the memory cell array M1.

A selected interconnect line L2($i$) is connected to the high-potential-side power supply potential Vdd, and a selected interconnect line L1($j$) is connected to the low-potential-side power supply potential Vss.

Among the first interconnect lines from the substrate side, unselected interconnect lines L1($j$−1), L1($j$+1) other than the selected interconnect line L1($j$) are connected to the power supply potential Vdd. Among the second interconnect lines from the substrate side, an unselected interconnect lines L2($i$+1) other than the selected interconnect line L2($i$) are connected to the power supply potential Vss.

Furthermore, third unselected interconnect lines L3($j$−1), L3($j$), L3($j$+1) from the substrate side are connected to the power supply potential Vss.

In this case, a forward bias is applied to the rectification element (e.g., a diode) in the selected cell unit CU1-sel. Thus, the read current I-read from the constant current source 12 runs through the memory element in the selected cell unit CU1-sel (the high-resistance state or the low-resistance state).

Therefore, for example, by detecting a potential change in a sense node when the read current I-read is running through the memory element, data (resistance value) in the memory element can be read.

Here, the value of the read current I-read needs to be much lower than the value of the set current I-set and the value of the reset current I-reset so that the resistance value of the memory element may not change in reading. When the change of the resistance value of the memory element depends on the pulse width of the current, the pulse width of the read current is set at a pulse width that does not change the resistance value of the memory element.

In reading, as in setting/resetting, a reverse bias is applied to the rectification element (diode) in the cell unit which is connected between the unselected interconnect lines L1($j$−1), L1($j$+1) and the unselected interconnect line L2($i$+1), among the unselected cell units CU1-unsel in the memory cell array M1.

A reverse bias is also applied to the rectification element (diode) in the cell unit which is connected between the selected interconnect line L2($i$) and the unselected interconnect lines L3($j$−1), L3($j$), L3($j$+1), among the unselected cell units CU2-unsel in the memory cell array M2.

The set/reset operation and read operation of the resistance change memory are performed as described above.

The following characteristics are required for the diode as the non-ohmic element: a high current (forward current) when a forward bias is applied, a sufficiently low current (reverse current) when a reverse bias is applied, and a sufficiently high breakdown voltage.

The operating characteristics of the non-ohmic element having the SiGe region used in the resistance change memory according to the embodiment of the present embodiment are described with FIG. 11.

FIG. 11 shows the cumulative probability of the non-ohmic element versus an output current. The horizontal axis in FIG. 11 indicates the value of the output current of the non-ohmic element at a given applied voltage, and the vertical axis in FIG. 11 indicates the cumulative probability of a current generated at a given applied voltage.

Black diamond-shaped plots (distribution A) in FIG. 11 indicate the characteristics of the non-ohmic element including the SiGe region according to the present embodiment in the case of a forward bias. On the other hand, white circular plots (distribution B) in FIG. 11 indicate the characteristics of a conventional non-ohmic element including no SiGe region in the case of a forward bias. FIG. 11 serves as the index to determine the quality (crystallization rate) of the crystallinity of a polysilicon layer included in the non-ohmic element.

The silicon layers (polysilicon layers) included in both of the elements are formed by crystallizing amorphous silicon under the same heating condition.

In FIG. 11, a greater number of plots in the distribution A of the current values of the non-ohmic element including the SiGe region according to the present embodiment are present within a range DR of certain current values than the plots in the distribution B of the current values of the non-ohmic element without the SiGe region.

On the other hand, a great number of plots in the distribution B of the current values of the conventional non-ohmic element are present within a range of current values lower than the current values of the range DR. This means that the output characteristics of the forward current of the conventional non-ohmic element are deteriorated as compared to the output characteristics of the forward current of the non-ohmic element including the SiGe region. That is, when these non-ohmic elements are subjected to the heat treatments for crystallization at the same temperature, the silicon layer in the non-ohmic element 30 including the SiGe region 39 according to the present embodiment is sufficiently crystallized, while the silicon layer in the conventional non-ohmic element is insufficiently crystallized.

It is contemplated that the silicon layer included in the conventional non-ohmic element is crystallized if the conventional non-ohmic element is subjected to a heat treatment for a long time at a high temperature. However, an excessive thermal load resulting from the high-temperature and long-time heat treatment is given to elements other than the non-ohmic element targeted for the heat treatment such as the memory element and transistors in the lower layer of the memory cell array, so that the characteristics of the memory element and others vary.

If the range DR in FIG. 11 is designated as an electric current specification for the resistance change memory (cell unit) as described above, an element having a greater number of plots of the distribution (cumulative probability) present in the range DR can be said to satisfy the required characteristics.

Accordingly, when the non-ohmic element includes the SiGe region as in the resistance change memory according to the present embodiment, the crystallization of amorphous silicon induced by heating during the formation of the element is accelerated and the crystallinity of the silicon layer included in the element is improved even if the size of the element becomes smaller. As a consequence, the characteristics of the element improve.

Furthermore, in the present embodiment, the SiGe region is provided in the silicon layer, such that the mobility of electrons (carriers) in the SiGe region can be improved. This also contributes to the improvement of the characteristics of the non-ohmic element provided with the SiGe region.

As described above, in the resistance change memory according to the present embodiment, the non-ohmic element 30 including the SiGe region 39 is improved in the crystallinity of the silicon layer and can stably output a predetermined current value, as in the examples shown in FIG. 7 and FIG. 9A to FIG. 9S.

Still further, when the non-ohmic element is the PIN diode shown in FIG. 9B and FIG. 9E in the configuration example described above, the crystallinity of the silicon layer is improved, and interface resistance between the P layer and the SiGe region can be reduced, so that the resistance change memory according to the present embodiment can supply a higher forward current to the memory element. Thus, in the set/reset operation of the resistance change memory, a current (forward current) high enough to change the resistance state of the memory element can be supplied to the memory element 20.

Consequently, the resistance change memory according to the embodiment of the present embodiment can increase the speed of its operation and improve the reliability/stability of the operation.

In the resistance change memory according to the present embodiment, the impurity (boron) contained in the P layer 33 can be inhibited from diffusing into the I layer 32 if the non-ohmic element constituting the cell unit is a PIN diode shown in FIG. 9B and FIG. 9E. Thus, the PIN diode shown in FIG. 9B and FIG. 9E makes it possible to reduce the generation of a reverse current of the diode and inhibit the wrong operation of the unselected cell unit.

Furthermore, in the read operation, the resistance change memory according to the present embodiment can increase the forward current as the read current and decrease the reverse current. Thus, in the resistance change memory according to the present embodiment, the read current can have a sufficient margin for the intensity of the reverse current and normally read data in the selected cell unit.

Moreover, since a greater number of unselected cell units are present than the number of selected cell units, the reduction of the reverse current contributes to the reduction of power consumption of the resistance change memory.

Consequently, the resistance change memory according to the present embodiment enables element miniaturization and the inhibition of element characteristic deterioration.

(5) Manufacturing Method (a) First Manufacturing Method

A first method of manufacturing the resistance change memory according to the present embodiment is described with FIG. 12A to FIG. 12F. Although a memory element is stacked on a non-ohmic element in the structure of a cell unit formed in the case of this manufacturing method, this manufacturing method is not limited to this structure.

FIG. 12A shows a sectional process view taken along the second direction of a memory cell array in one step of the present manufacturing method.

As shown in FIG. 12A, a conductive layer 60X serving as a interconnect line is deposited on a substrate (e.g., an interlayer insulating film) 11 by, for example, a chemical vapor deposition (CVD) method or a sputter method.

A plurality of layers for forming a non-ohmic element of a cell unit are sequentially deposited on the conductive layer 60X by, for example, the chemical vapor deposition (CVD) method.

For example, when the non-ohmic element is a PIN diode, three semiconductor layers 31X, 32X, 33X are stacked on the conductive layer 60X so that a conductive layer 35X is interposed in between. The conductive layer 35X is used as an electrode for the non-ohmic element. However, the number of layers (films) to constitute the non-ohmic element such as the semiconductor layers varies depending on the structures shown in FIG. 8A to FIG. 8C.

In this manufacturing method, the PIN diode having the structure shown in FIG. 9A is illustrated as an example.

In the case of the PIN diode having the structure shown in FIG. 9A, the semiconductor layer 31X is an N-type silicon layer (N layer), the semiconductor layer 33X is a P-type silicon layer (P layer), and the semiconductor layer 32X between the N layer 31X and the P layer 33X is an I-type silicon layer (I layer). The thickness of the N layer 31X is about 1 nm to 30 nm. The thickness of the I layer 32X is about 20 nm to 100 nm. The thickness of the P layer 33X is about 1 nm to 30 nm.

The silicon layers 31X, 32X, 33X are formed as amorphous silicon layers when deposited.

The stacking order of the three layers 31X, 32X, 33X that constitute the PIN diode is appropriately changed depending on which of the circuit configurations indicated by a to p of FIG. 4 the cell unit has.

In addition, TiN or silicide may be formed as a diffusion preventing layer and/or adhesive layer between the conductive layer 60X and the conductive layer 35X serving as an electrode of the non-ohmic element. A high-concentration impurity layer may be formed between the conductive layer 35X and the semiconductor layer 31X. The conductive layer 35X serving as the electrode may be used as a diffusion preventing layer.

A SiGe region 39X is formed in the entire or part of the amorphous silicon layers 31X, 32X, 33X for forming the non-ohmic element. In the example of FIG. 12A, a SiGe region 39X is provided in the silicon layer (I layer) 32X without any contact with the silicon layer (N layer) 31X and the silicon layer (P layer) 33X. A silicon region $38_1$X intervenes between the N layer 31X and the SiGe region 39X. A silicon region $38_2$X intervenes between the P layer 33X and the SiGe region 39X.

It goes without saying that the silicon regions $38_1$X, $38_2$X in the I layer 32X are amorphous silicon before a heat treatment.

The SiGe region 39X is formed in the I layer 32X by a chemical reaction between silicon and germanium induced when the I layer 32X is being deposited, that is, induced by the in-situ addition of germanium (e.g., a gas phase).

Instead of directly forming the SiGe region (SiGe layer) in the silicon layer, a germanium layer (Ge layer) may be inserted into the silicon layer to form the SiGe region.

Furthermore, when a silicon layer to provide the SiGe region is being deposited, the Ge layer may be inserted into this silicon layer in situ. Alternatively, after a layer to provide the SiGe region is deposited, the Ge layer may be formed in the deposited layer by an ion implantation method.

The SiGe region does not have to be directly formed as described above because the SiGe region is formed by a chemical reaction between germanium contained in the Ge layer and silicon contained in the silicon layer which is induced by the subsequent heat treatment.

In the manufacturing method described in the present embodiment, the amorphous silicon layers 31X, 32X, 33X where the SiGe region 39X is formed are not limited to the example shown in FIG. 12A. The SiGe region or the Ge layer is appropriately formed in the predetermined layers 31X, 32X, 33X depending on which of the structures shown in FIG. 9A to FIG. 9S the non-ohmic element (here, the PIN diode) has.

After the SiGe region 39X is formed, the amorphous silicon layers 31X, 32X, 33X are subjected to a heat treatment at a temperature ranging from about 500° C. to 750° C. for about one second to 180 seconds, thereby crystallizing amorphous silicon. For example, a rapid thermal annealing (RTA) method is used for the heat treatment.

When the Ge layer is inserted in the silicon layer, silicon and germanium chemically react and are bonded together by the heat treatment, and the SiGe region 39X is formed.

At the time of crystallization from amorphous silicon to polysilicon caused by the heat treatment, the quantity of heat for the crystallization of amorphous silicon decreases due to the addition of germanium to the silicon layer (here, the I layer). Further, germanium in the silicon layer becomes a crystal nucleus for the crystallization of silicon. Moreover, the crystallization (crystal growth) of silicon is encouraged reflecting the crystal face (crystal orientation) of silicon germanium.

In the example shown in FIG. 12A, amorphous silicon is crystallized around the SiGe region from the SiGe region 39X to the lower silicon layer (N layer) 31X and from the SiGe region 39X to the upper silicon layer (P layer) 33X. Amorphous silicon is thus crystallized, and the crystallized silicon layer becomes polycrystalline silicon or monocrystalline silicon.

As a result, even if the layers 31X, 32X, 33X made of amorphous silicon are reduced in area or thickness, the crystallization of amorphous silicon is accelerated, and the crystallinity of crystallized silicon is improved.

Therefore, the crystallinity of the silicon layers constituting the small-sized non-ohmic element can be improved without any heat treatment at a higher temperature than when the size of the element is greater or without any multiple long-time heat treatments. When the size of the element is smaller, quantity of heat for the crystallization of amorphous silicon is greater. Thus, the above-mentioned effects are greater when the size of the element is smaller. Moreover, the non-crystallization of the silicon layer prevents the silicon layer from becoming an insulator or prevents the silicon layer from not passing a current. Thus, a non-ohmic element driven by a predetermined operation can be formed.

After polysilicon is formed from amorphous silicon by the heat treatment, a conductive layer 36X is formed on the crystallized semiconductor layer 33X. The conductive layer 36X is made of a silicide layer, a metal layer, metal compound layer or a stack structure of these layers. When the conductive layer is a silicide layer, a common heat treatment may be used to form the silicide layer (silicide treatment) and to crystallize silicon.

When Ge is formed in the silicon layer (here, the I layer), a Ge layer having a small thickness (e.g., an atomic layer level) may remain in the SiGe region 39X.

FIG. 12B shows a sectional process view taken along the second direction of the memory cell array in one step of the present manufacturing method.

As shown in FIG. 12B, a first electrode layer 25X, a resistance change film 21X and a second electrode layer 26X are sequentially deposited on a conductive layer (silicide layer) 39X as constituent parts of the memory element. The electrode layers 25X, 26X are formed by, for example, the CVD method or sputter method. The resistance change film 21X is formed by, for example, the sputter method, the CVD method, an atomic layer deposition (ALD) method, or a metal-organic CVD (MOCVD) method.

The materials for the electrode layers 25X, 26X and the resistance change film 21X are selected by the combination of materials whereby the resistance value of the resistance change film 21X reversibly changes and the changed resistance value of the resistance change film 21X is retained in a nonvolatile manner. However, the material for the electrode layers 25X, 26X is not limited as long as the resistance change film 21X itself reversibly changes its resistance value due to externally provided energy (e.g., a voltage or heat) and retains the changed resistance value.

As described above, a metal oxide, a metal compound or organic matter is used for the resistance change film 21X.

FIG. 12C shows a sectional process view taken along the second direction of the memory cell array in one step of the present manufacturing method.

As shown in FIG. 12C, a mask (not shown) having a predetermined shape is formed on an electrode layer 26Y by, for example, a photolithographic technique or a sidewall transfer/fabrication technique. For example, each layer under the mask is processed in accordance with the shape of the mask by etching that uses a reactive ion etching (RIE) method. As a result, the electrode layer 25Y, 26Y, a resistance change film 21Y, a conductive layers 35Y, 36Y and silicon layers 31Y, 32Y, 33Y are sequentially processed, and divided into cell units in the second direction.

Thus, a stack 100 is formed on the substrate 11. The formed stack 100 extends in the first direction.

Simultaneously with the formation of the stack, the conductive layer on the substrate 11 is processed, and a interconnect line 60 extending in the second direction is formed on the substrate 11.

Then, an interlayer insulating film 69 is embedded between the adjacent stacks 100 by, for example, the CVD method or a coating method.

In addition, in this step, the stack 100 may be divided in the first direction and a interconnect line extending in the second direction may be formed to form the first memory cell array M1 shown in FIG. 2. However, in a cross-point type memory cell array, the cell unit and the memory cell array are preferably formed in the manufacturing process shown in FIG. 12D to FIG. 12F without dividing the stack 100 in the first direction to form the cell unit (memory cell array) immediately after the step shown in FIG. 12C.

Figure 12D:
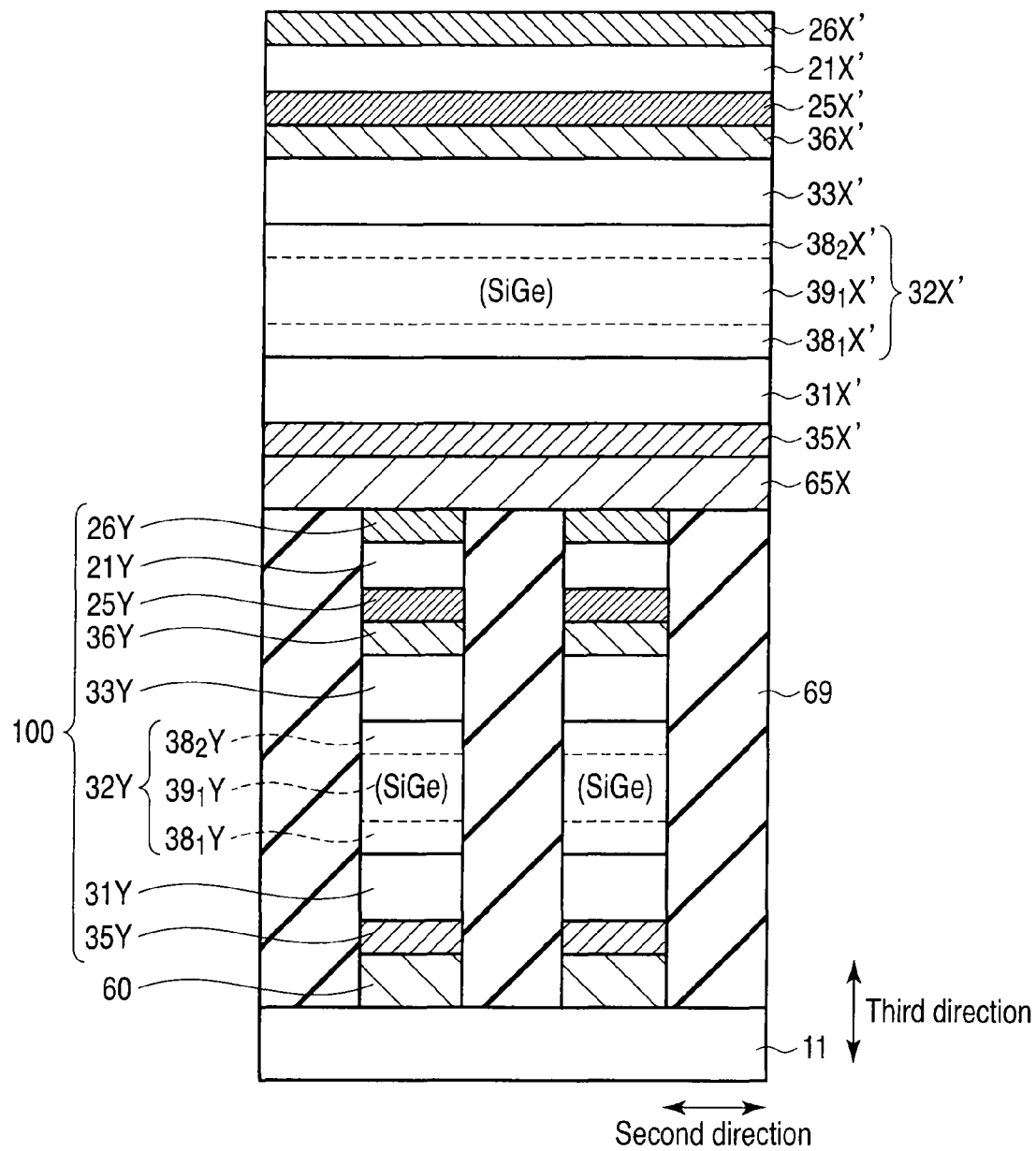
FIG. 12D is diagram showing one step of a method of manufacturing the resistance change memory according to the embodiment.

FIG. 12D shows a sectional process view taken along the second direction of the memory cell array in one step of the present manufacturing method. FIG. 12E shows a sectional process view taken along the first direction of the memory cell array in one step of the present manufacturing method.

As shown in FIG. 12D and FIG. 12E, a conductive layer 65X serving as a second interconnect line is deposited on the stack 100 and interlayer insulating film 69 extending in the first direction. Then, layers to constitute the cell unit of a second memory cell array are sequentially deposited on the conductive layer 65X. The stacking order of the layers deposited on the conductive layer 65X varies depending on which of the connection relations indicated by a to p of FIG. 4 two cell units stacked with one interconnect line (conductive layer 65X) in between have.

For ease of explanation, the two cell units have the connection relation indicated by a of FIG. 4 in the case described here. That is, in the example shown in FIG. 12E, the stacking order of layers 35X', 31X', 32X', 33X', 36X', 25X', 21X', 26X' on the conductive layer 65X is the same as the stacking order of the layers constituting the stack 100. The layers stacked on the conductive layer 65X are formed in the same manufacturing process as the layers constituting the stack 100.

Figure 12F:
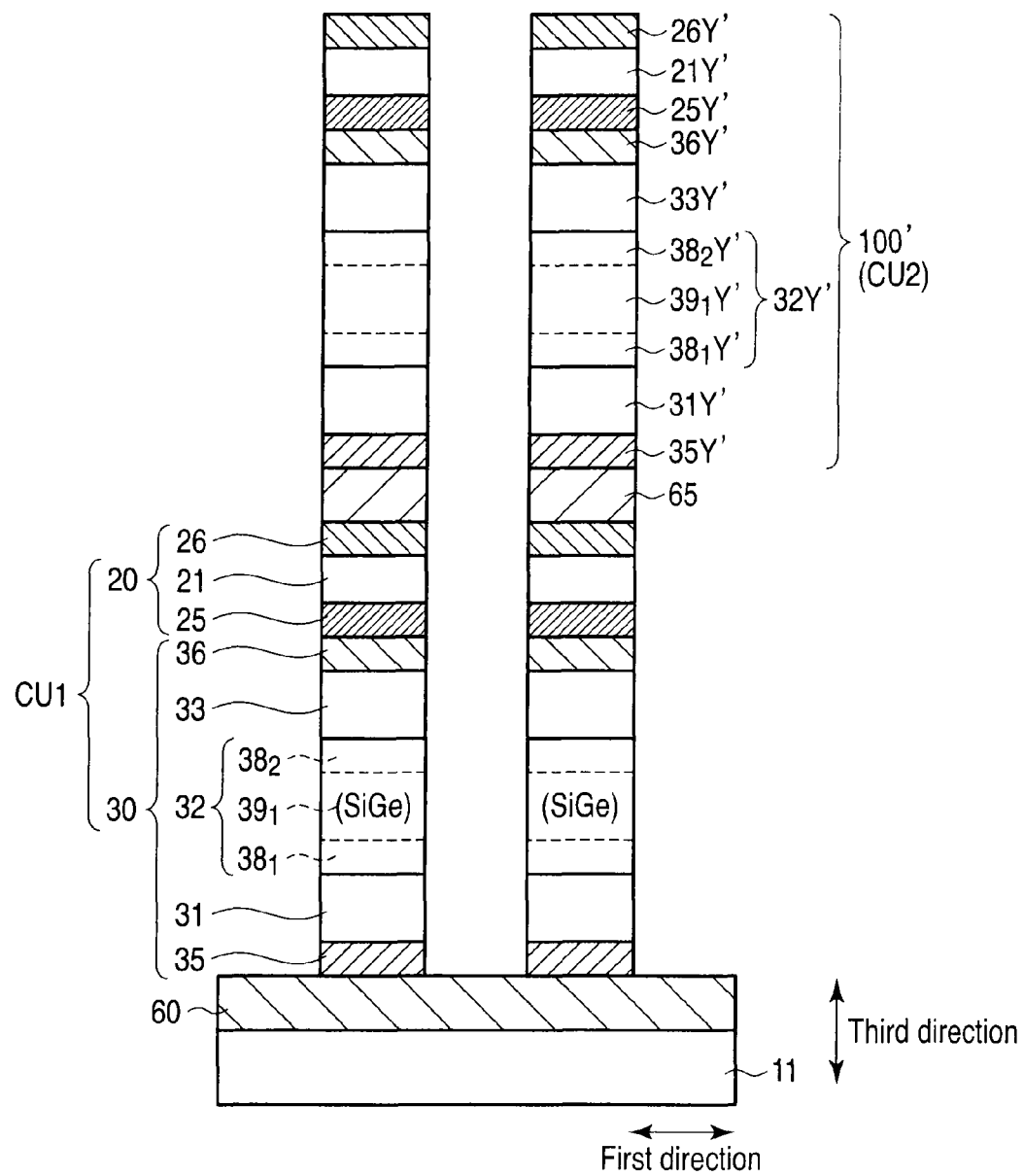
FIG. 12F is diagram showing one step of a method of manufacturing the resistance change memory according to the embodiment.

FIG. 12F shows a sectional process view taken along the first direction of the memory cell array in one step of the present manufacturing method.

The layers 26X', 21X', 25X', 36X', 33X', 32X', 31X', 35X', 65X and the underlying stack 100 on the interconnect line 60 shown in FIGS. 12D and 12E are processed by the photolithographic technique, the sidewall transfer/fabrication technique or the RIE method in such a manner as to ensure the etching selectivity for the interconnect line 60.

As a result, the layers 26X', 21X', 25X', 36X', 33X', 32X', 31X', 35X', 65X are divided in the first direction. The stack 100 extending in the first direction under these layers is divided into cell units in the first direction.

Thus, as shown in FIG. 12F, a cell unit CU1 is formed between the interconnect line 60 extending in the first direction and the interconnect line 65 extending in the second direction.

In the cell unit CU1, the non-ohmic element (e.g., a PIN diode) 30 has a SiGe region $39_1$ therein. On a conductive layer 36 on the top of the non-ohmic element 30, a memory element 20 of the cell unit CU1 is formed.

Moreover, since the layers are etched starting from the upper layer in order, a stack 100' is formed on the cell unit CU1 with the interconnect line 65 in between. Similarly to the interconnect line 65, the stack 100' is divided in the first direction. In the step shown in FIG. 12F, the stack 100' extends in the second direction, in the same manner as in FIG. 12D. In the cross-point type memory cell array, the stack 100' is processed in the second direction into a cell unit CU2 of a (second-layer) memory cell array to be higher than the first-layer memory cell array.

Interlayer insulating films are embedded between the cell units CU1 adjacent in the first direction and between the stacks 100' adjacent in the first direction.

In the step shown in FIG. 12F, the sectional structure of the part where the cell units are formed along the second direction is the same as the sectional structure shown in FIG. 12D.

Here, when memory cell arrays are further provided on the stacks 100', the process similar to the process shown in FIG. 12D to FIG. 12F is repeated before a predetermined number of memory cell arrays are stacked.

Amorphous silicon may be crystallized into polysilicon by one heat treatment after a predetermined number of stacked memory cell arrays are formed rather than by heat treatments for the respective layers (memory cell arrays).

As shown in FIG. 12D to FIG. 12F, the second-layer memory cell array is processed simultaneously with the formation of the first-layer memory cell array on the substrate 11.

Thus, the formation of the upper memory cell array and the processing of the lower memory cell array are carried out in a common step, so that the process of manufacturing the resistance change memory having the cross-point type memory cell array is simpler and its manufacturing costs are lower than when each memory cell array in each layer (each wiring level) is processed in the first and second directions.

The resistance change memory according to the present embodiment is manufactured by the process described above.

As described above, among two or more layers 31X, 32X, 33X that constitute the non-ohmic element (here, a PIN diode), the layer (silicon portion) containing silicon is formed using amorphous silicon when these layers 31X, 32X, 33X are deposited.

Then, the SiGe region $39_1$ (or Ge layer) is formed all over or partly in these layers.

The quantity of heat for the crystallization of silicon decreases due to germanium contained in the SiGe region when the heat treatment for crystallizing amorphous silicon is carried out. Moreover, germanium or silicon germanium encourages and accelerates the crystallization of silicon.

Thus, in the method of manufacturing the resistance change memory according to the present embodiment, the crystallization of amorphous silicon is accelerated by the SiGe region $39_1$ provided in the silicon portion of the non-ohmic element.

As a result, even if the miniaturization of the element has advanced, a polysilicon layer having improved crystallinity can be formed from an amorphous silicon layer without any high-temperature (e.g., about 800° C.) and long-time heat treatment or without any multiple heat treatments.

Therefore, in the first method of manufacturing the resistance change memory according to the present embodiment, the non-ohmic element of the resistance change memory can be formed in such a manner as to inhibit element characteristic deterioration resulting from the insufficient crystallization or deteriorated crystallinity of the silicon layer included in the non-ohmic element.

Furthermore, as described above, in the method of manufacturing the resistance change memory according to the present embodiment, the silicon layer is sufficiently crystallized, so that a high-temperature heat treatment or multiple long-time heat treatments is not used. Thus, in the cross-point type resistance change memory, a thermal load resulting from the heat treatment on the elements formed on the silicon substrate and on the elements formed in the memory cell array can be reduced. Therefore, the method of manufacturing the resistance change memory according to the present embodiment can also inhibit element characteristic deterioration resulting from the thermal load.

Consequently, according to the first method of manufacturing the resistance change memory in the embodiment of the present embodiment, a resistance change memory with miniaturized elements and inhibited element characteristic deterioration can be provided.

(b) Second Manufacturing Method

Figure 13:
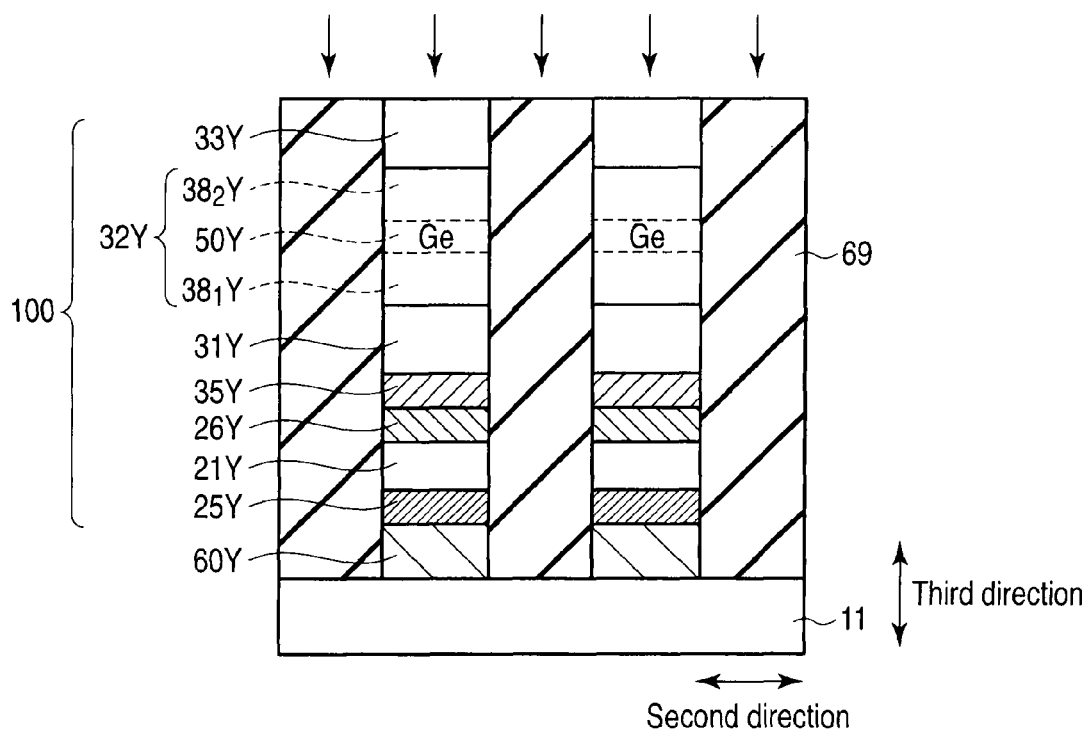
FIG. 13 is a diagram showing one step of the method of manufacturing the resistance change memory according to the embodiment.

A second method of manufacturing the resistance change memory according to the embodiment of the present embodiment is described with FIG. 13. It is to be noted that parts equivalent to the parts described in the first manufacturing method are denoted with the same reference numbers and are not described. It is also to be noted that steps equivalent to the steps in the first manufacturing method are not described here.

In the case described in the first manufacturing method, the SiGe region $39_1$ is formed in the silicon layer constituting the non-ohmic element before a plurality of layers constituting the cell unit are processed into a stack of a predetermined shape (dimension). However, the SiGe region $39_1$ may be formed in the silicon layer after the stack is formed.

As shown in FIG. 13, if the SiGe region $39_1$ is formed in the amorphous silicon layer 32X by ion implantation after the stack 100 is formed, the cell unit preferably has a structure in which the non-ohmic element (e.g., a PIN diode) is stacked on the memory element.

For example, as shown in FIG. 13, an electrode layer 25Y, a resistance change film 21Y and an electrode layer 26Y are sequentially deposited on a conductive layer 60Y. Further, three amorphous silicon layers 31Y, 32Y, 33Y are sequentially deposited on the electrode layer 26Y.

As in the step shown in FIG. 12C, a stack 100 is formed by the photolithographic technique and the RIE method. Then, an interlayer insulating film 69 is embedded between the adjacent stacks 100.

Germanium is implanted into predetermined positions (regions) of the silicon layers 31Y, 32Y, 33Y in the processed stack 100 by the ion implantation method, and a germanium layer 50Y is formed in a predetermined silicon layer (here, the I layer 32).

Since the silicon layers 31Y, 32Y, 33Y are provided on the resistance change film 21Y with the conductive layer 35Y in between, no damage is caused to the resistance change film 21Y by the ion implantation.

Furthermore, as in the step shown in FIG. 12A, a heat treatment is carried out to crystallize silicon, so that silicon in the silicon layer (I layer) 32X chemically reacts with germanium in the germanium layer 50Y, and a SiGe region is formed in the I layer. This heat treatment also crystallizes amorphous silicon into polysilicon.

The germanium layer may remain in the formed SiGe region. When the SiGe region is formed by the reaction between silicon and germanium, a smaller amount (concentration) of germanium in the germanium layer 50Y formed in the silicon layer is preferable in terms of the prevention of the diffusion of the remaining germanium layer 50Y to other regions.

As in the first manufacturing method, added germanium and the formed SiGe region encourages and accelerates the crystallization of silicon, and amorphous silicon is crystallized into polysilicon. This improves the crystallinity of the silicon layers 31X, 32X, 33X.

In the case where the memory element is stacked on the non-ohmic element as well, the silicon layers constituting the non-ohmic element may be once processed, and germanium may be implanted into predetermined positions of the stacked silicon layers by ion implantation. In this case, the step of depositing and processing the layers constituting the memory element is carried out after the non-ohmic element is processed.

As described above, according to the second method of manufacturing the resistance change memory in the embodiment of the present embodiment, a resistance change memory with miniaturized elements and inhibited element characteristic deterioration can be provided as in the first manufacturing method.

(6) Specific Example

Figure 14:
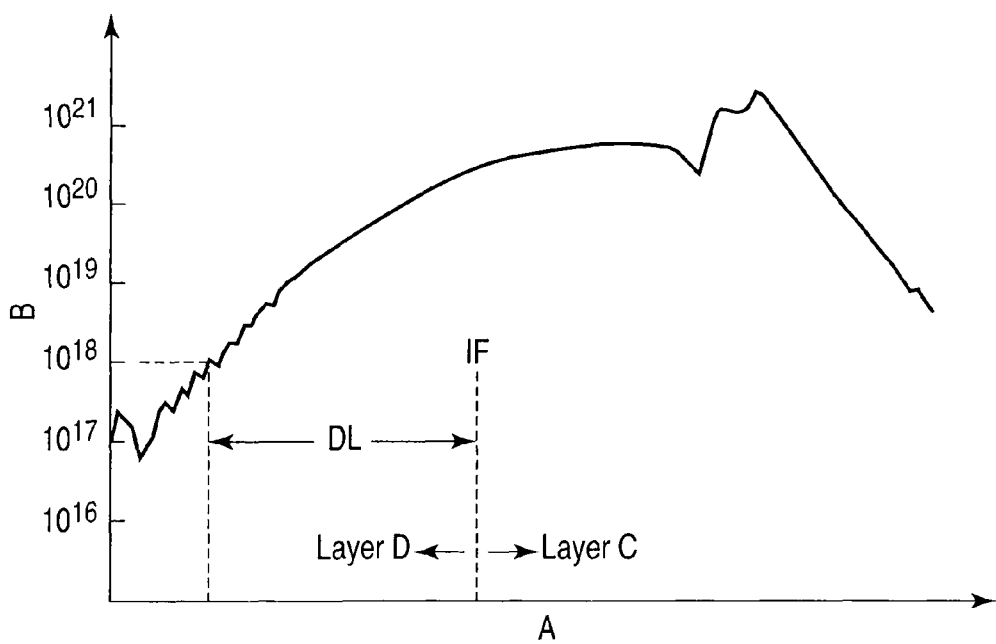
FIG. 14 is a graph illustrating a specific example of the non-ohmic element in the resistance change memory according to the embodiment.

A specific example of the resistance change memory according to the present embodiment is described with FIG. 14 and FIG. 15.

As described above, silicon germanium tends to inhibit the diffusion of boron (B) contained in the P-type silicon layer (P layer). Thus, the SiGe region 39 is provided in the P layer 33 or provided in the I-type silicon layer (I layer) 32 in contact with (adjacently) the P layer 33 as in the non-ohmic element (PIN diode) having the structure of FIG. 9B or FIG. 9E, so that deterioration of the reverse bias characteristics of the non-ohmic element can be inhibited.

However, silicon germanium also tends to diffuse phosphorus (P) contained in the N-type silicon layer (N layer). It is therefore preferable not to provide the SiGe region in the N layer 31 or to locate the SiGe region away from the N layer 31 to take into account the diffusion length of phosphorus contained in the N layer.

FIG. 14 shows the profile of the impurity concentration of phosphorus (P) in the stack (junction) of an Si layer (indicated by "Layer D" in the graph) and the N-type silicon layer (N layer) (indicated by "Layer C" in the graph). The horizontal axis (indicated by "A" in the graph) in FIG. 14 corresponds to the dimension (unit: [nm]) in the depth direction of the stack of the Si layer and the N layer. The vertical axis (indicated by "B" in the graph) in FIG. 14 corresponds to the impurity concentration (unit: $[cm^{-3}]$) of phosphorus (P).

In the stack, the Si layer is provided on the N layer. The vertical axis side of the horizontal axis in FIG. 14 is the top surface side of the stack (Si layer) in the third direction, and the side of the horizontal axis opposite to the vertical axis is the bottom surface side of the stack (N layer) in the third direction.

Generally, the region in which phosphorus (P) is diffused can be regarded as a region extending from an interface IF between the SiGe layer and the N layer to a part where the impurity concentration of phosphorus is $10^{18}$ $cm^{-3}$. In the example shown in FIG. 14, the diffusion length DL of phosphorus is, for example, about 20 nm.

FIG. 15 shows one specific structure example of a PIN diode as the non-ohmic element in the resistance change memory according to the present embodiment.

As shown in FIG. 15, it is preferable that the SiGe region 39 be provided the diffusion length DL of phosphorus or more away from the N layer 31 containing phosphorus (P) to take the diffusion of phosphorus into account.

For example, an intrinsic (I-type) silicon region 38 is provided between the SiGe region 39 and the N layer 31. The dimension (thickness) of the silicon region 38 in the depth direction (third direction) is set at least 20 nm or more at the time of the formation of the region (layer) 38. However, as phosphorus is diffused due to a heating process during the formation of the element, the thickness of the silicon region 38 can reach 20 nm or less in the end (at the completion of the non-ohmic element), which is, however, permitted as long as the diffusion of phosphorus is not encouraged. In addition, the silicon region 38 may be a silicon layer of any other conductivity type but the N layer 31.

In FIG. 15, the SiGe region 39 extends in the P layer 33, and the P layer 33 includes a SiGe region. In this case as well, even if the P layer 33 includes the SiGe region, the diffusion of phosphorus up to the P layer 33 does not almost occur as long as the SiGe region 39 is the diffusion length DL of phosphorus or more away from the N layer 31 as in this example.

Thus, element characteristic deterioration can be improved by providing the SiGe region 39 in the element 30 the diffusion length DL of phosphorus or more away from the N layer 31.

Moreover, in the present specific example, the I layer can be reduced in thickness because the effect of the diffusion of phosphorus on the I layer including the SiGe region is smaller than when the whole I layer 32 is a SiGe region.

Consequently, the specific example of the resistance change memory according to the present embodiment also enables element miniaturization and the inhibition of element characteristic deterioration.

(7) Modification

A modification of the resistance change memory according to the present embodiment is described with FIG. 16A and FIG. 16B. FIG. 16A shows the planar shape of the non-ohmic element in the present modification. FIG. 16B shows the sectional structure taken along the line b-b of FIG. 16A.

In FIG. 7 and FIG. 9A to FIG. 9S, the laminated SiGe region 39 is provided in the non-ohmic element 30.

However, as shown in FIG. 16A and FIG. 16B, a dot-like SiGe region 39A (hereinafter referred to as a SiGe dot 39A) may be provided in the non-ohmic element 30. In the present modification, the dot shape means a columnar shape, a prismatic shape, an elliptic shape, a spherical shape, a pyramid shape or a conical shape. The SiGe dot 39A shown in FIG. 16A and FIG. 16B is prismatic but is not limited to this shape.

Here, a PIN diode is illustrated as the non-ohmic element 30.

The SiGe dots 39A are, for example, two-dimensionally arranged in the I layer 32. Although the SiGe dots 39A are only provided in the I layer 32 in FIG. 16A and FIG. 16B, the SiGe dots 39A may be provided in other silicon layers such as the N layer 31 or the P layer 33.

When the SiGe dots 39A are provided in the silicon portion of the PIN diode (non-ohmic element) as shown in FIG. 16A and FIG. 16B, the crystallization of amorphous silicon can be accelerated as in the case where the laminated SiGe region is provided in the non-ohmic element.

Therefore, when the SiGe dots 39A are provided in the silicon layer as in the present modification, the crystallinity of the silicon layers (polysilicon layers) constituting the non-ohmic element 30 can also be improved.

Consequently, the modification of the resistance change memory according to the present embodiment also enables element miniaturization and the inhibition of element characteristic deterioration.

(8) Material Examples

Material examples of the non-ohmic element in the resistance change memory according to the present embodiment are described below.

The resistance change memory in the embodiment of the present embodiment has been described above illustrating silicon and silicon germanium as the semiconductor layers that constitute the non-ohmic element. However, materials other than silicon and germanium may be used in the embodiment of the present embodiment as long as such materials are semiconducting materials that can encourage the crystallization of the amorphous semiconductor layer by heating.

For example, effects substantially similar to the effects obtained by the embodiment of the present embodiment can be provided by a semiconducting material having a similar crystal structure, a semiconducting material close in the lattice constant of crystal (small in lattice misfit) or a semiconducting material close in thermal expansion coefficient during heating.

Thus, instead of silicon and silicon germanium, a substance can be selected from the group consisting of SiC, C, GaAs, a semiconductor oxide, a semiconductor nitride, a semiconductor carbide and a semiconductor sulfide.

The P-type semiconductor layer is preferably made of one or a combination of substances selected from the group consisting of P-type Si, $TiO_2$, $ZrO_2$, $InZO_x$, ITO, $SnO_2$ containing Sb, ZnO containing Al, $AgSbO_3$, $InGaZO_4$ and ZnO—$SnO_2$.

The N-type semiconductor layer is preferably made of one or a combination of substances selected from the group consisting of N-type Si, $NiO_x$, ZnO, $Rh_2O_3$, ZnO containing N, ZnO containing In and $La_2CuZO_4$.

A substance is selected from the following substances for the insulating layer to constitute a non-ohmic element such as a MIS diode.

a) Oxides $SiO_2$, $Al_2O_3$, $Y_2O_3$, $La_2O_3$, $Gb_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO $AB_2O_4$ However, A and B are the same element or different elements, and are one or a combination of substances selected from the group consisting of Al, Sc, Ti, V, Cr, Mn, Fe, Co, Ni, Cu, Zn, Ga and Ge For example, $Fe_3O_4$, $FeAl_2O_4$, $Mn_{1+x}Al_{2-x}O_{4+y}$, $CO_{1+x}Al_{2-x}O_{4+y}$, or $MnO_x$.

$ABO_3$

However, A and B are the same element or different elements, and are one or a combination of substances selected from the group consisting of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In and Sn.

For example, $LaAlO_3$, $SrHfO_3$, $SrZrO_3$ or $SrTiO_3$.

b) Oxynitrides

SiON, AlON, YON, LaON, GdON, CeON, TaON, HfON, ZrON, TiON, LaAlON, SrHfON, SrZrON, SrTiON, HfSiON, HfAlON, ZrSiON, ArAlON, AlSiON

Substances in which part of the oxygen element of the above-mentioned oxides of a) is substituted for a nitrogen element For the insulating layer to constitute the MIS diode in particular, a substance is preferably selected from the group consisting of $SiO_2$, SiN, $Si_3N_4$, $Al_2O_3$, SiON, $HfO_2$, HfSiON, $Ta_2O_5$, $TiO_2$ and $SrTiO_3$.

The Si-based insulating films made of, for example, $SiO_2$, SiN, and SiON includes insulating films in which the density of both the oxygen element and nitrogen element is $1 \times 10^{18}/cm^3$ or more.

The insulating film also includes impurity atoms forming a defect level, or substances containing semiconductor/metal dots (quantum dots).

For a conductive interconnect line using as a word line/bit line, one or a combination of substances is selected from the group consisting of W, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $XrSi_x$, $MnSi_x$ and $FeSi_x$. When the conductive interconnect line is formed of a plurality of substances, a constituent part of the conductive interconnect line may be made up of mixed crystal layers of a plurality of substances.

The electrode layer and the conductive layer include, for example, a single metal element or a plurality of mixtures, a silicide or oxide, and a nitride. Specifically, the electrode layer and the conductive layer are made of one or a combination of substances selected from the group consisting of Pt, Au, Ag, Ru, Ir, Ti, V, Cr, Mn, Fe, Co, Ni, Cu, Al, Rh, RuN, TiN, TaN, TiAlN, TaAlN, $SrRuO_x$, $LaNiO_x$, $PtIrO_x$, $PtRhO_x$, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$ and $FeSi_x$. When the electrode layer and the conductive layer are formed by using a plurality of substances, constituent parts of the electrode layer and the conductive layer may be made up of mixed crystal layers of a plurality of substances.

If one or a combination of two or more substances selected from the group consisting of $TiSi_x$, $VSi_x$, $CrSi_x$, $MnSi_x$, $FeSi_x$, $CoSi_x$, $NiSi_x$, $NdSi_x$, $MoSi_x$, $HfSi_x$, $TaSi_x$, $WSi_x$, $PdSi_x$, $IrSi_x$, $PtSi_x$, $RhSi_x$, $ReSi_x$ and $OsSi_x$ is used as a silicide for the P-type silicon layer (P layer), the interface resistance between the P-type silicon layer and the silicide layer can be reduced. When two or more silicides are used to form the electrode layer (conductive layer) for the P-type silicon layer (P layer), the electrode layer may be made of mixed crystal layers of two or more silicides.

If one or a combination of two or more substances selected from the group consisting of $TiSi_x$, $VSi_x$, $CrSi_x$, $MnSi_x$, $FeSi_x$, $CoSi_x$, $NiSi_x$, $NdSi_x$, $MoSi_x$, $HfSi_x$, $TaSi_x$, $YSi_x$, $YbSi_x$, $ErSi_x$, $HoSi_x$, $DySi_x$, $GdSi_x$ and $TbSi_x$ is used as a silicide for the N-type silicon layer (N layer), the interface resistance between the N-type silicon layer and the silicide layer can be reduced. When two or more silicides are used to form the electrode layer (conductive layer) for the N-type silicon layer (N layer), the electrode layer may be made of mixed crystal layers of two or more silicides.

The electrode layer may have both of the functions of the diffusion preventing layer and the adhesive layer.

However, this electrode layer includes a metal layer to constitute the MIS diode (which can be used together).

The metal layer to constitute the MIS diode is made of one or a combination of substances selected from the group consisting of a). a single element or a mixture of a plurality of metal elements, b). a compound metal as an oxide, carbide, boride, nitride, or silicide, and c). $TiN_x$, $TiC_x$, $TiB_x$, $TiSi_x$, $TaC_x$, $TaB_x$, $TaN_x$, $WC_x$, $WB_x$, W, $WSi_x$, $TaSi_x$, $LaB_x$, $LaN_x$, $LsSi_x$, $HfSi_x$, Hf, $YSi_x$, $ErSi_x$, $NiSi_x$, $PtSi_x$, $PdSi_x$, $CoSi_x$, $MnSi_x$, $CrSi_x$ and $FeSi_x$.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a first interconnect line extending in a first direction;
   a second interconnect line extending in a second direction intersecting with the first direction; and
   a cell unit which is provided between the first interconnect line and the second interconnect line and which includes a non-ohmic element and a memory element, the non-ohmic element including a conductive layer provided on at least one of first and second ends of the non-ohmic element and a silicon portion provided between the first and second ends, and the memory element being connected to the non-ohmic element via the conductive layer and storing data in accordance with a reversible change in a resistance state,
   wherein the non-ohmic element includes a first silicon germanium region in the silicon portion, and the first silicon germanium region is separated from the conductive layer.

2. The resistance change memory according to claim 1, wherein
   the non-ohmic element includes a P-type silicon layer and an N-type silicon layer provided in the silicon portion, and
   the first silicon germanium region is separated from the N-type silicon layer.

3. The resistance change memory according to claim 1, wherein
   an intrinsic silicon region is provided between the first silicon germanium region and an N-type silicon layer.

4. The resistance change memory according to claim 1, wherein
   the non-ohmic element includes a P-type silicon layer provided in the silicon portion, an N-type silicon layer provided in the silicon portion, and an intrinsic silicon layer provided between the P-type silicon layer and the N-type silicon layer in the silicon portion, and
   the first silicon germanium region is provided in the intrinsic silicon layer.

5. The resistance change memory according to claim 4, wherein
   the first silicon germanium region is separated from the P-type silicon layer and the N-type silicon layer.

6. The resistance change memory according to claim 4, wherein
   the first silicon germanium region is in contact with the P-type silicon layer and is separated from the N-type silicon layer.

7. The resistance change memory according to claim 4, wherein
   the non-ohmic element includes a second silicon germanium region provided in the P-type silicon layer.

8. The resistance change memory according to claim 7, wherein
   the second silicon germanium region is in contact with the first silicon germanium region.

9. The resistance change memory according to claim 1, wherein
   the silicon portion is made of polycrystalline silicon or monocrystalline silicon.

10. The resistance change memory according to claim 1, wherein
    the conductive layer includes at least one kind of substance selected from the group consisting of
    Pt, Au, Ag, Ru, Ir, Ti, V, Cr, Mn, Fe, Co, Ni, Cu, Al, Rh, RuN, TiN, TaN, TiAlN, TaAlN, $SrRuO_x$, $LaNiO_x$, $PtIrO_x$, $PtRhO_x$, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$ and $FeSi_x$.

11. The resistance change memory according to claim 1, wherein
    the first silicon germanium region is dot-shaped.

* * * * *